ations.

United States Patent
Sugiyama et al.

(10) Patent No.: US 11,004,767 B2
(45) Date of Patent: May 11, 2021

(54) COMPOSITE MATERIAL, ELECTRONIC APPARATUS, AND METHOD FOR MANUFACTURING ELECTRONIC APPARATUS

(71) Applicant: SONY CORPORATION, Tokyo (JP)

(72) Inventors: Taiki Sugiyama, Kanagawa (JP); Yuichi Ishida, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/470,438

(22) PCT Filed: Nov. 29, 2017

(86) PCT No.: PCT/JP2017/042775
§ 371 (c)(1),
(2) Date: Jun. 17, 2019

(87) PCT Pub. No.: WO2018/135140
PCT Pub. Date: Jul. 26, 2018

(65) Prior Publication Data
US 2020/0098663 A1 Mar. 26, 2020

(30) Foreign Application Priority Data
Jan. 19, 2017 (JP) .............................. JP2017-007665

(51) Int. Cl.
| | |
|---|---|
| *H01L 23/373* | (2006.01) |
| *C08L 93/00* | (2006.01) |
| *H01L 23/29* | (2006.01) |
| *H04N 9/31* | (2006.01) |

(52) U.S. Cl.
CPC .......... *H01L 23/3737* (2013.01); *C08L 93/00* (2013.01); *H01L 23/29* (2013.01); *H01L 23/3738* (2013.01); *H04N 9/3144* (2013.01)

(58) Field of Classification Search
CPC .. C08L 93/00; H01L 23/3737; H01L 23/3738; H04N 9/3144
See application file for complete search history.

(56) References Cited

U.S. PATENT DOCUMENTS

| | | | | |
|---|---|---|---|---|
| 4,965,290 A | * | 10/1990 | Hoshiko ................ | C08L 27/18 521/54 |
| 7,550,097 B2 | * | 6/2009 | Tonapi .................... | C09K 5/14 106/1.18 |
| 8,587,945 B1 | * | 11/2013 | Hartmann ............... | G06F 1/203 361/708 |

(Continued)

FOREIGN PATENT DOCUMENTS

| | | |
|---|---|---|
| CN | 1577415 A | 2/2005 |
| CN | 101308911 A | 11/2008 |

(Continued)

OTHER PUBLICATIONS

International Search Report and Written Opinion of PCT Application No. PCT/JP2017/042775, dated Feb. 27, 2018, 14 pages of ISRWO.

*Primary Examiner* — Nicholas J Tobergte
(74) *Attorney, Agent, or Firm* — Chip Law Group

(57) ABSTRACT

A composite material includes a base resin, a heat dissipation filler that is mixed into the base resin, hollow particles that are mixed into the base resin, hollow particles that are mixed into the base resin, and bubbles that are formed in the base resin.

24 Claims, 25 Drawing Sheets

(56) References Cited

U.S. PATENT DOCUMENTS

| | | | |
|---|---|---|---|
| 9,478,683 B2* | 10/2016 | Fujita | H04N 5/2257 |
| 10,564,524 B2* | 2/2020 | Sugiyama | G06F 1/203 |
| 10,703,856 B2* | 7/2020 | Kobatake | C08L 63/00 |
| 2004/0263443 A1 | 12/2004 | Shirasaki | |
| 2008/0286637 A1 | 11/2008 | Yusa et al. | |
| 2011/0214852 A1* | 9/2011 | Wang | C09K 5/00 165/185 |
| 2015/0350392 A1* | 12/2015 | Park | H05K 7/20336 455/575.6 |
| 2016/0130492 A1* | 5/2016 | Matsumura | H01L 23/3737 252/75 |
| 2016/0156213 A1* | 6/2016 | Yajima | H01L 23/34 320/152 |
| 2017/0137561 A1* | 5/2017 | Fujiwara | C08G 59/245 |
| 2017/0234390 A1 | 8/2017 | Kaji et al. | |
| 2018/0212290 A1* | 7/2018 | Saiga | H01M 10/6565 |
| 2018/0251610 A1* | 9/2018 | Yoshizaki | B29C 70/20 |
| 2020/0006195 A1* | 1/2020 | Bessho | H01L 23/42 |

FOREIGN PATENT DOCUMENTS

| | | |
|---|---|---|
| CN | 106574680 A | 4/2017 |
| CN | 107109011 A | 8/2017 |
| EP | 2003714 A2 | 12/2008 |
| EP | 3173653 A1 | 5/2017 |
| EP | 3221392 A1 | 9/2017 |
| JP | 2002-128931 A | 5/2002 |
| JP | 2005-017917 A | 1/2005 |
| JP | 2008-287992 A | 11/2008 |
| JP | 2011-088974 A | 5/2011 |
| JP | 2012-102263 A | 5/2012 |
| JP | 2013-095761 A | 5/2013 |
| JP | 2013-153361 A | 8/2013 |
| JP | 2013-231166 A | 11/2013 |
| JP | 2016-098301 A | 5/2016 |
| KR | 10-0723645 B1 | 5/2007 |
| KR | 10-2017-0038798 A | 4/2017 |
| WO | 2012/063672 A1 | 5/2012 |
| WO | 2016/013078 A1 | 1/2016 |
| WO | 2016/081673 A1 | 5/2016 |

\* cited by examiner

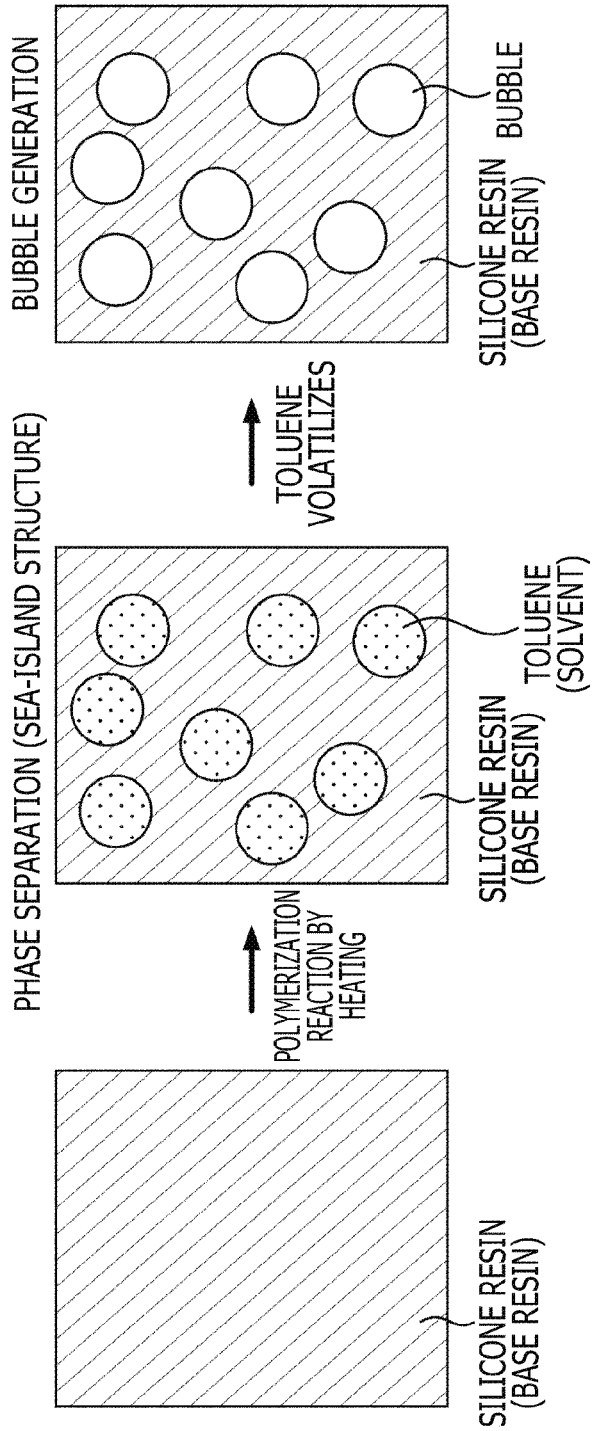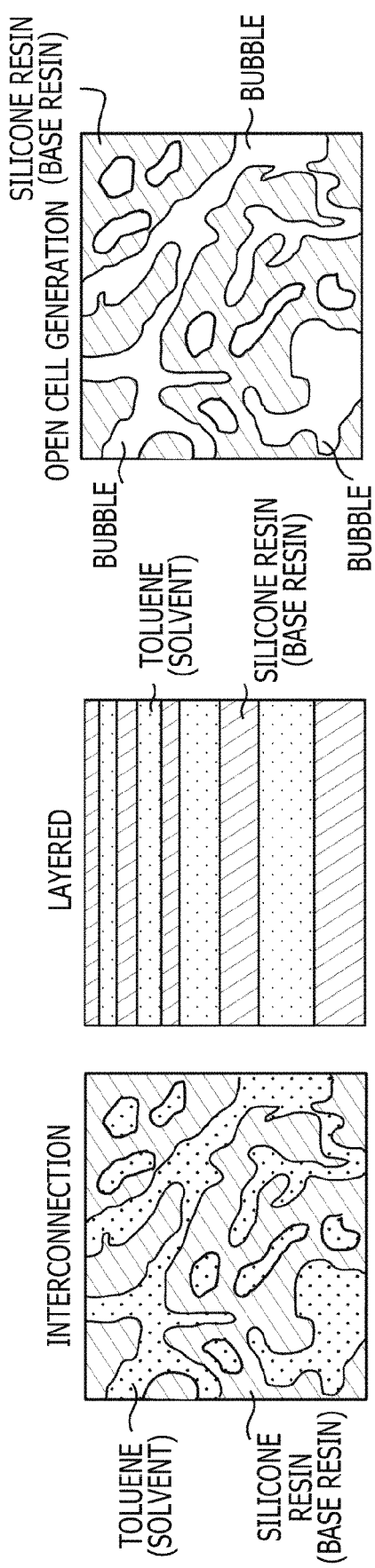

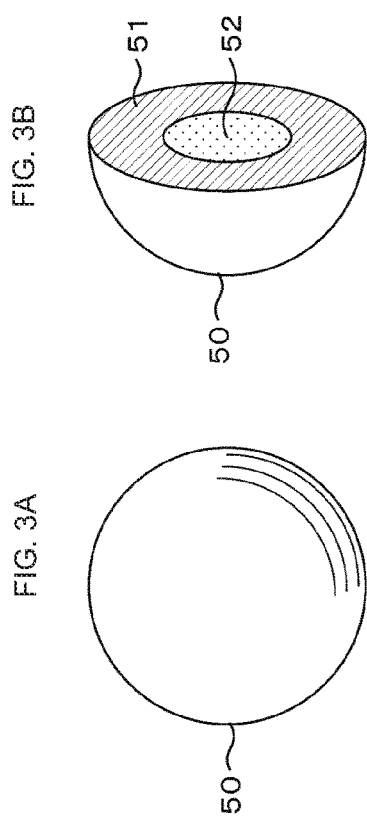
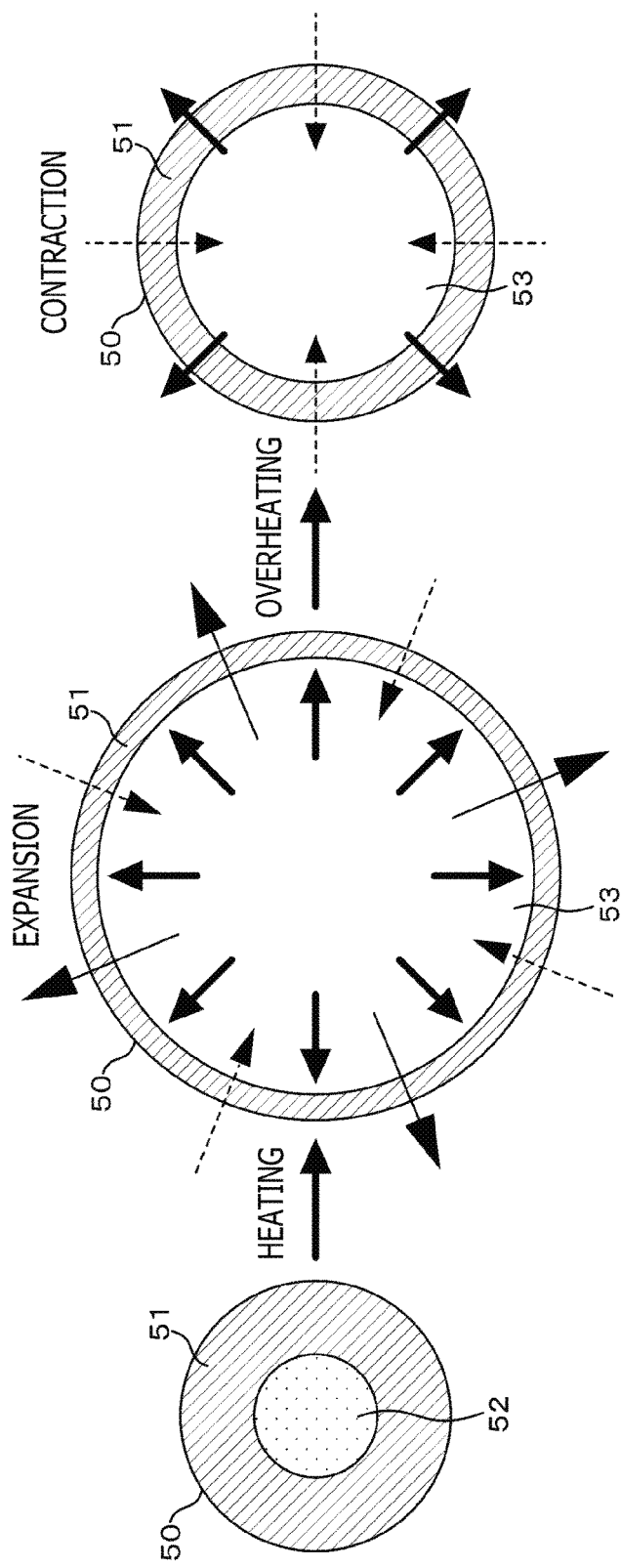

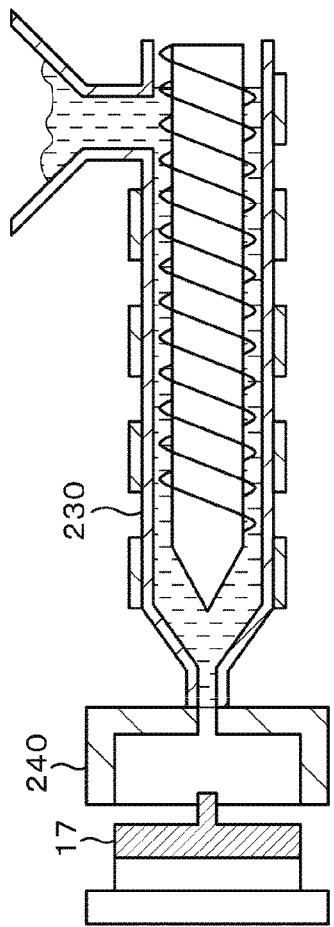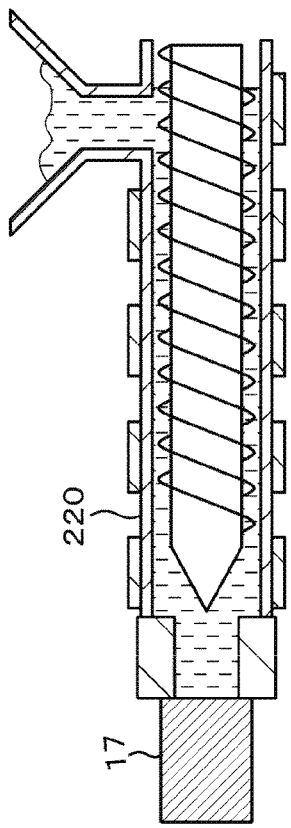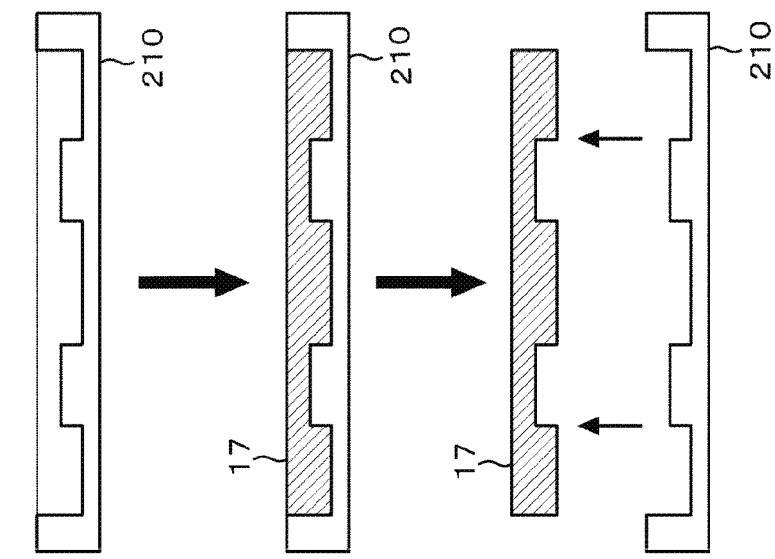

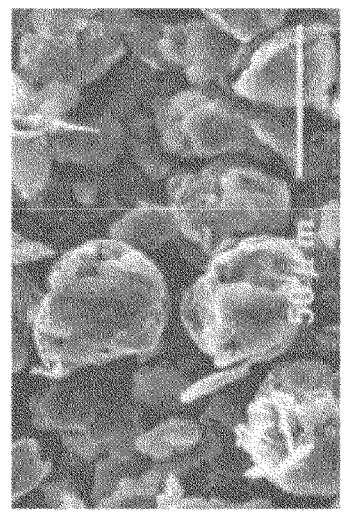
FIG. 8A
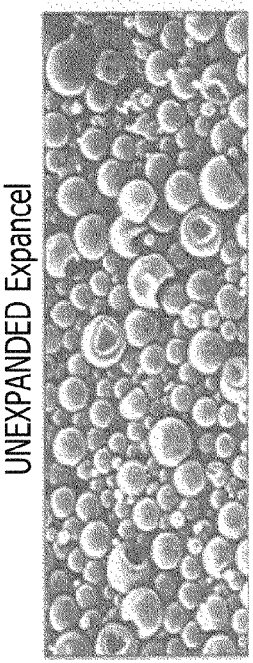
FIG. 8B

FIG. 9
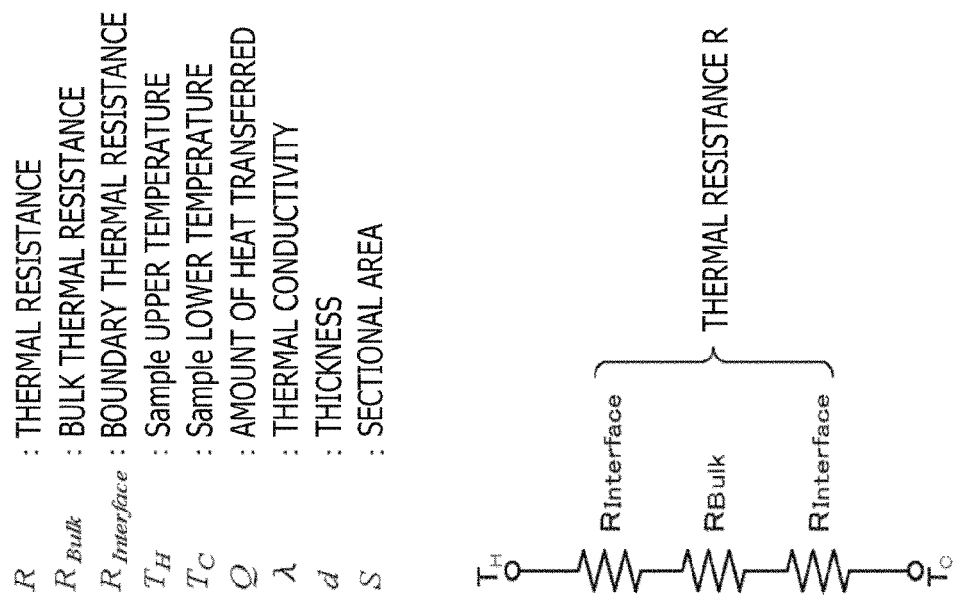
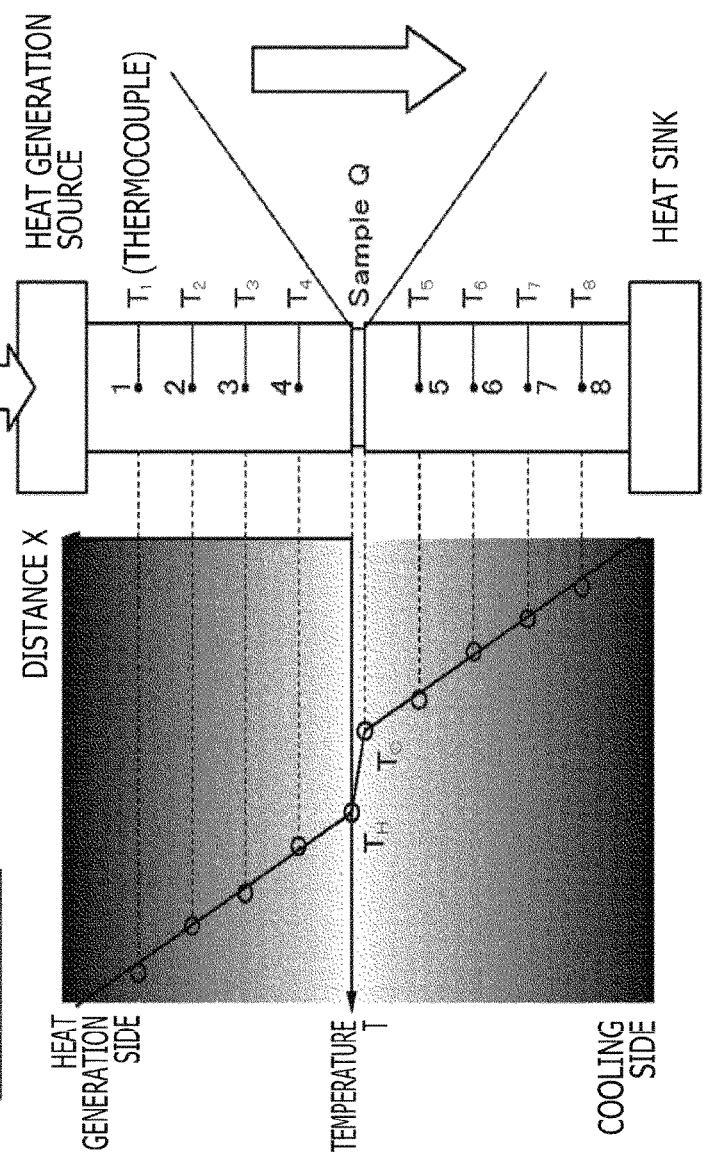

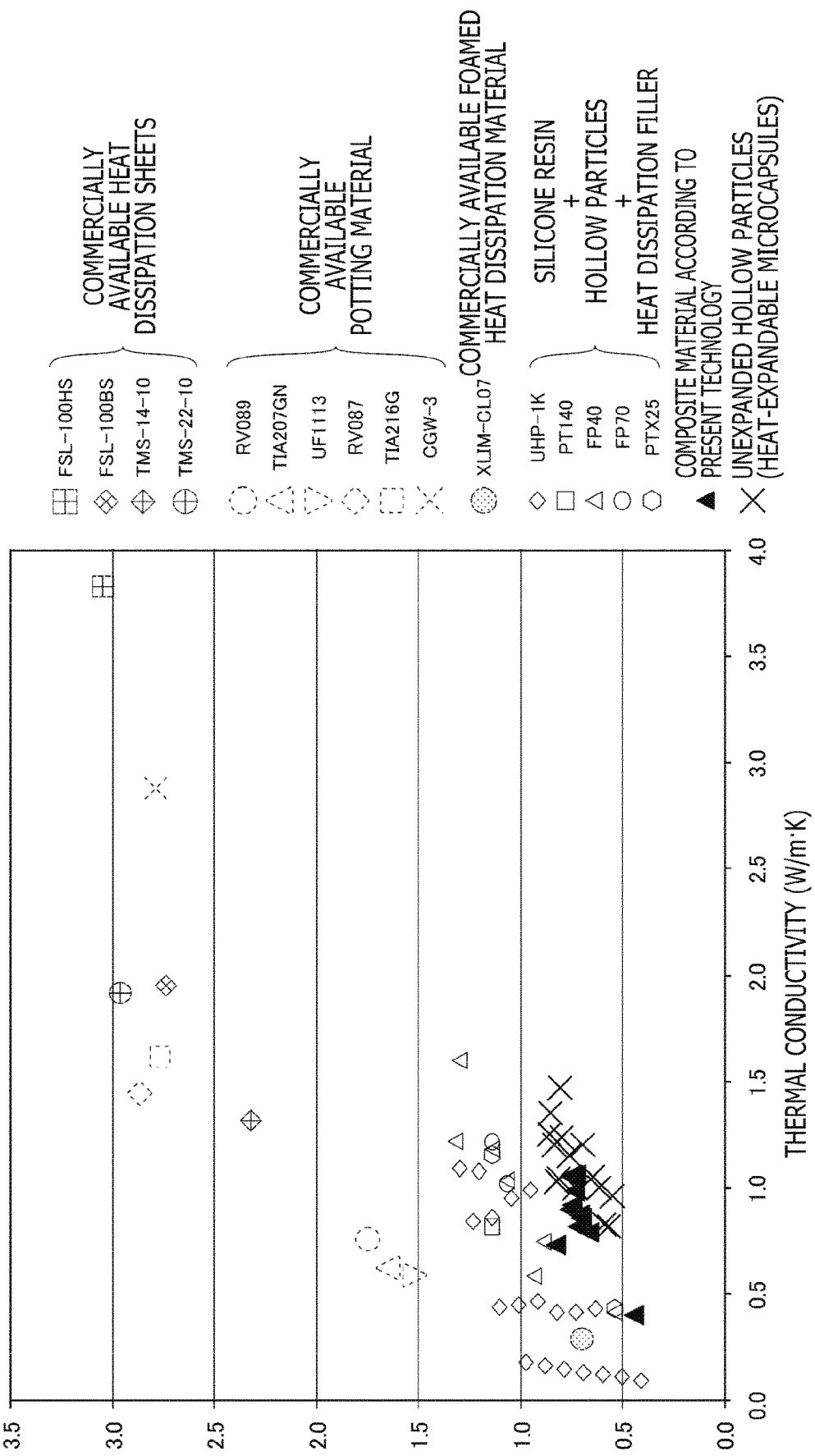

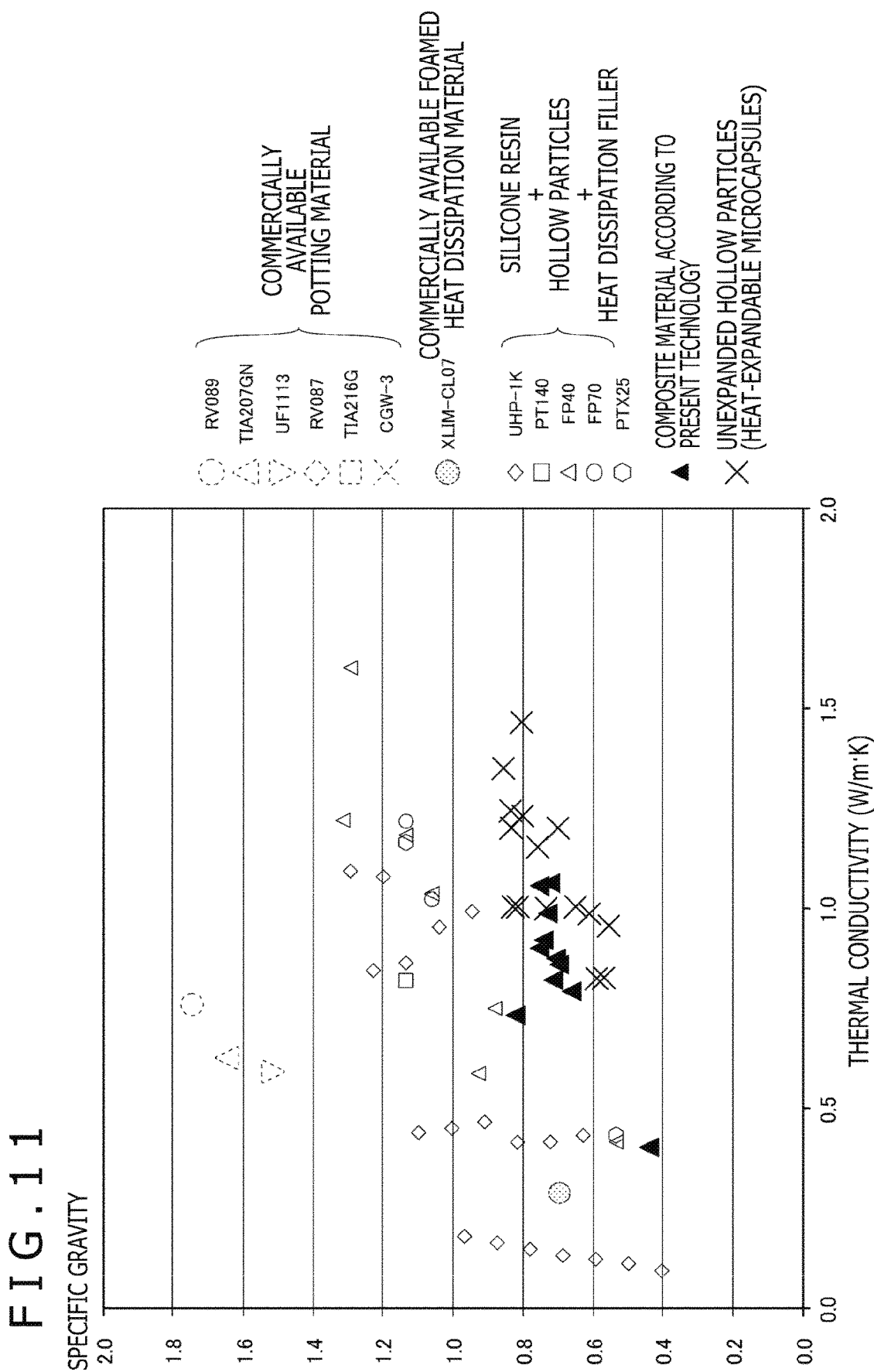

COMPOSITE MATERIAL, ELECTRONIC APPARATUS, AND METHOD FOR MANUFACTURING ELECTRONIC APPARATUS

CROSS REFERENCE TO RELATED APPLICATIONS

This application is a U.S. National Phase of International Patent Application No. PCT/JP2017/042775 filed on Nov. 29, 2017, which claims priority benefit of Japanese Patent Application No. JP 2017-007665 filed in the Japan Patent Office on Jan. 19, 2017. Each of the above-referenced applications is hereby incorporated herein by reference in its entirety.

TECHNICAL FIELD

The present technology relates to a composite material, an electronic apparatus, and a method for manufacturing an electronic apparatus.

BACKGROUND ART

Heretofore, for efficiently dissipating the heat generated from electronic parts, there has been proposed a technology in which the inside of an housing of an electronic apparatus and spaces between the electronic parts and heat dissipation parts are filled with a resin having a high heat dissipation performance (called potting) (PTL 1). By filling the spaces with a resin higher than air in thermal conductivity, the heat generated from the electronic parts can be efficiently dissipated.

CITATION LIST

Patent Literature

[PTL 1]
JP 2013-231166A

SUMMARY

Technical Problem

However, the resin high in heat dissipation performance is generally filled with inorganic particulates having a high density such as alumina ($Al_2O_3$), boron nitride (BN) and aluminum nitride (AlN) as a heat dissipation filler, and, accordingly, this resin is higher than a base resin in specific gravity. Filling of an electronic apparatus or the like with a large amount of the heat dissipation resin has a problem that the weight of the electronic apparatus is increased. Thus, there is a need for a composite material which is light (low in specific gravity) and high in thermal conductivity.

The present technology has been made in consideration of such a problem. It is an object of the present technology to provide a composite material which is high in thermal conductivity, is excellent in heat dissipation effect, and is light (low in specific gravity), an electronic apparatus, and a method for manufacturing an electronic apparatus.

Solution to Problem

In order to solve the above-mentioned problem, a first technology is a composite material including a base resin, a heat dissipation filler that is mixed into the base resin, hollow particles that are mixed into the base resin, and bubbles formed in the base resin.

A second technology is a composite material including a base resin, a heat dissipation filler mixed into the base resin, shells mixed into the base resin, and bubbles formed in the shells.

In addition, a third technology is an electronic apparatus including a housing, an imaging element provided inside the housing, an electric power source provided inside the housing, and a composite material that is placed to fill a space inside the housing, is thermally connected to at least either of the imaging element and the electric power source, and is thermally connected to the housing. The composite material includes a base resin, a heat dissipation filler that is mixed into the base resin, hollow particles that are mixed into the base resin, and bubbles that are formed in the base resin.

Further, a fourth technology is a method for manufacturing an electronic apparatus, the method including: preliminarily molding a composite material having a base resin, a heat dissipation filler that is mixed into the base resin, hollow particles that are mixed into the base resin, and bubbles that are formed in the base resin, by a predetermined molding method; and providing the molded composite material in such a manner that the molded composite material is thermally connected to any one of heat generation sources inside a housing of the electronic apparatus, and is thermally connected to the housing.

Advantageous Effect of Invention

According to the present technology, it is possible to realize a composite material which is high in thermal conductivity, is excellent in heat dissipation effect, and is light (low in specific gravity), and an electronic apparatus. Note that the effect described here is not limitative, and the effect of the present technology may be any one of the effects described herein.

BRIEF DESCRIPTION OF DRAWINGS

FIG. 2A depicts illustrations of bubbling by volatilization of a solvent, and FIG. 2B depicts figures depicting another example of phase separation.

FIGS. 3A, 3B, and 3C depict figures depicting the configuration of a heat-expandable microcapsule.

FIG. 7A depicts figures depicting a method for cast molding, FIG. 7B is a figure depicting a method for extrusion, and FIG. 7C is a figure depicting a method for injection molding.

FIG. 8A is a figure depicting a state of a granular heat dissipation filler, and FIG. 8B depicts figures depicting unexpanded hollow capsules and expanded hollow capsules.

FIG. 9 is an illustration of a measuring method by use of a thermal resistance measuring instrument.

FIG. 10 is a graph depicting the results of comparison between a composite material according to the present embodiment and a comparative example.

FIG. 11 is a graph depicting the results of comparison between a composite material according to the present embodiment and a comparative example.

DESCRIPTION OF EMBODIMENTS

Figure 1:
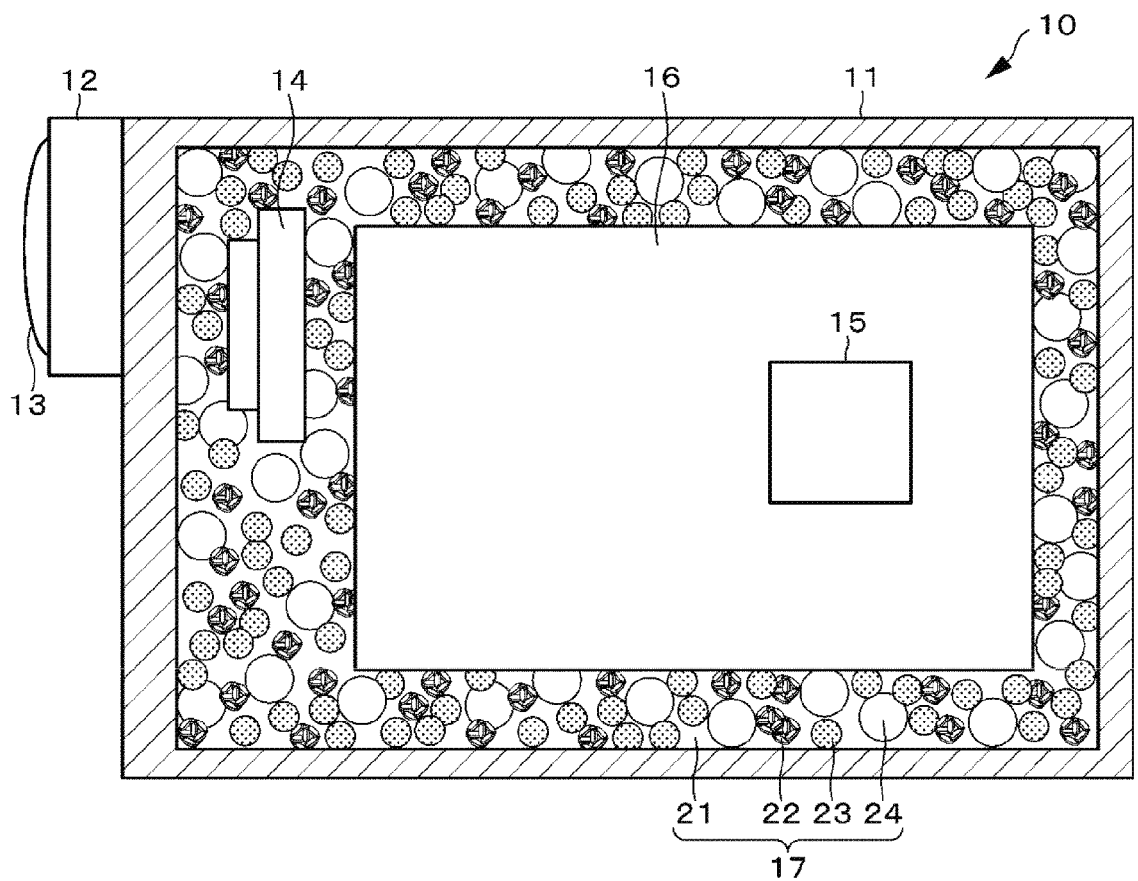
FIG. 1 is a figure depicting an example of the configurations of an electronic apparatus and a composite material according to an embodiment of the present disclosure.

Embodiments of the present technology will be described below referring to the drawings. Note that the description will be made in the following order.
<1. Embodiments>
[1-1. Configuration of Electronic Apparatus]
[1-2. Configuration of Composite Material]
[1-3. Method for Filling with Composite Material]
[1-4. Method for Disposing Composite Material]
[1-5. Production of Composite Material and Comparison of Physical Properties]
<2. Examples of Application to Other Apparatuses>
[2-1. First Example]
[2-2 Second Example]
[2-3 Third Example]
[2-4 Fourth Example]
[2-5 Fifth Example]
[2-6 Example of Preliminary Molding]
<3. Modifications>

1. Embodiments 1-1. Configuration of Electronic Apparatus

First, one configuration example of an imaging apparatus which is an electronic apparatus 10 according to an embodiment will be described. FIG. 1 is a figure depicting the configuration of the electronic apparatus 10.

The electronic apparatus 10 includes a housing 11, an optical imaging system 12, an imaging element 14, a control circuit 15, a battery 16, and a composite material 17.

The housing 11 is configured using a synthetic resin such as plastic, or a metal or the like, and constitutes an armor of the electronic apparatus 10. The optical imaging system 12, the imaging element 14, the control circuit 15, a battery 16, and the composite material 17 are provided inside the housing 11.

The optical imaging system 12 includes an imaging lens 13 for focusing light from a subject to the imaging element 14, a driving mechanism for moving the imaging lens 13 to perform focusing and zooming, an iris mechanism, a shutter mechanism and the like. These are driven under control of the control circuit 15. An optical image of the subject obtained through the optical imaging system 12 is made to form an image on the imaging element 14. The driving mechanism, the iris mechanism, the shutter mechanism and the like of the optical imaging system 12 are operated by a lens driving driver (not illustrated) including, for example, a microcomputer, in accordance with the control of the control circuit 15.

The imaging element 14 converts incident light coming from the subject into charge amounts by photoelectric conversion, and outputs the charge amounts as an analog imaging signal. The analog imaging signal outputted from the imaging element 14 is outputted to the control circuit 15. As the imaging element 14, there may be used a CCD (Charge Coupled Device), a CMOS (Complementary Metal Oxide Semiconductor) or the like.

The control circuit 15 includes a CPU (Central Processing Unit), a RAM (Random Access Memory), a ROM (Read Only Memory) and the like. The ROM stores, for example, a program to be read by the CPU and executed. The RAM is used as a work memory of the CPU. The CPU executes various processes according to the program stored in the ROM, and issues commands, thereby controlling the whole and each part of the electronic apparatus 10. The control circuit 15 is mounted on the electronic apparatus 10 in the form of, for example, a semiconductor integrated circuit, a semiconductor chip, or the like.

The control circuit 15 applies sample holding or the like to the imaging signal outputted from the imaging element 14, by a CDS (Correlated Double Sampling) processing such as to keep a favorable S/N (Signal/Noise) ratio. Further, the control circuit 15 controls gain by an AGC (Auto Gain Control) processing, and performs A/D (Analog/Digital) conversion, to output a digital image signal.

In addition, the control circuit 15 applies predetermined signal processing such as a demosaic processing, a white balance adjustment processing, a color correction processing, a gamma correction processing, a Y/C conversion processing, an AE (Auto Exposure) processing, a resolution conversion processing, etc. to the image signal. Further, the control circuit 15 applies an encoding processing for, for example, recording or communication, to the image data having undergone the predetermined processing.

The battery 16 is a power source for supplying electric power to each of the parts constituting the electronic apparatus 10. As the battery 16, there may be used, for example, a lithium ion battery.

A space inside the housing 11 is filled with the composite material 17. The composite material 17 includes a base resin 21, a heat dissipation filler 22, hollow particles 23, and bubbles 24. The composite material 17 is thermally connected (physically in contact with) all or part of heat generation sources inside the electronic apparatus 10, namely, electronic parts such as the imaging element 14, the control circuit 15, and the battery 16 and the inner surfaces of the housing 11, and is for restraining rises in the temperatures inside the electronic apparatus 10 and of the surfaces of the housing 11 by dissipating the heat generated from these heat generation sources. The details of the configuration of the composite material 17 will be described later.

Though illustration is omitted, the electronic apparatus 10 may be provided, in addition to the above-mentioned components, with a storage medium, a display section, an input section, a communication terminal and/or the like. The storage medium may be, for example, a large-capacity storage medium, such as an HDD (Hard Disc Drive), an SSD (Solid State Drive), and an SD memory card. Images picked up by the electronic apparatus 10 are stored in the state of being compressed based on a standard such as, for example, JPEG (Joint Photographic Experts Group). In addition, EXIF (Exchangeable Image File Format) data including information regarding the stored images and additional information such as imaging date and time are also stored, in correspondence with the images. Besides, moving images are stored in the form of, for example, MPEG2 (Moving Picture Experts Group 2), MPEG4 or the like.

The display section may be, for example, a display device including an LCD (Liquid Crystal Display), a PDP (Plasma Display Panel), an organic EL (Electro Luminescence) panel or the like. A user interface for the electronic apparatus 10, a menu screen, a monitoring image being imaged, a picked-up image stored in the storage medium, a picked-up moving image and the like are displayed on the display section.

The input section may include, for example, a power source button for switching turning-on and turning-off of a power source, a release button for instructing the start of recording of an image to be picked up, an operating element for zoom adjustment, a touch screen configured to be integral with the display section, and/or the like. When an input is given to the input section, a control signal according to the input is produced, and is outputted to the control circuit 15. Then, the control circuit 15 performs an arithmetic processing and/or a control corresponding to the control signal.

The communication terminal is for connecting the electronic apparatus 10 and an external apparatus by use of a cable. The connection enables transmission and reception of data between the electronic apparatus 10 and the external apparatus. Examples of the external apparatus include a personal computer, a printer, a smartphone, a tablet terminal, a storage device such as a hard disc drive or a USB (Universal Serial Bus) memory, and a display device such as a television set or a projector. Examples of the standard for communication include USB, LAN (Local Area Network), and HDMI (registered trademark) (High-Definition Multimedia Interface). Note that the communication with the external apparatus is not limited to wired connection, but may be conducted by wireless connection using Wi-Fi (Wireless Fidelity), wireless LAN, ZigBee, Bluetooth (registered trademark) or the like.

The electronic apparatus 10 is configured in the above-described manner.

1-2. Configuration of Composite Material

The details of the composite material 17 placed to fill the space inside the electronic apparatus 10 will be described below. The composite material 17 includes the base resin 21, the heat dissipation filler 22, the hollow particles 23, and the bubbles 24, and functions as a heat dissipation material.

The composite material 17 is liquid and fluid before curing (solidification), and is cured (solidified) by heating of one liquid or by mixing or heating of two liquids. The viscosity of the composite material 17 is preferably 500 Pa·s or below, more preferably 100 Pa·s or below. A curing (solidification) condition is several hours in an environment of room temperature to 100° C., preferably several minutes in an environment of room temperature to 60° C.

While the details will be described later, the composite material 17 is placed to fill the space inside the electronic apparatus 10 by pouring, and, therefore, its viscosity is preferably low for ensuring easy pouring. It is to be noted, however, that the viscosity may be high in the case where the composite material in a solid state is placed on a component part in the electronic apparatus 10 or where the composite material is solidified.

The composite material 17 after curing (solidification) has an insulating property. The density of the composite material 17 after curing (solidification) is preferably 2.0 g/cm$^3$ or below, and more preferably 1.0 g/cm$^3$ or below. In addition, the thermal conductivity of the composite material 17 after curing (solidification) is preferably 0.5 W/m·K or above, and more preferably 1.0 W/m·K or above. Further, the hardness of the composite material 17 is preferably an Asker C hardness of 60° C. or below, and more preferably an Asker C hardness of 30° C. or below.

Note that the composite material 17 may be one that is cured (solidified) by reacting with moisture or the like in air, or by heating or subjecting to an anaerobic condition, after pouring into the housing 11, or may be one that is cured (solidified) inside the housing 11 by reaction with moisture in air, or by heating or subjecting to an anaerobic condition, after mixing of two liquids. It is to be noted, however, that the composite material 17 may be one that can be used as it is in a liquid state. Note that the final form of the composite material 17 after filling may be any of a gel form, a rubber form, and a hard solid form.

The final form of the base resin 21 after filling may be any of a gel form, a rubber form, and a hard solid form. It is only necessary that a raw material of the base resin 21 is a liquid having such an appropriate viscosity that it can be poured into the housing 11 and it can be placed to fill and held in the housing 11. The base resin 21 is characterized by being higher in thermal conductivity than air (thermal conductivity: 0.02 W/m·K). Examples of the base resin 21 include silicones, urethane, epoxy, acrylic, olefin, phenolic, polyimide and the like elastomer materials. For used as a filler, silicone gel, silicone rubber, urethane gel, urethane rubber, acrylic resin, epoxy resin and the like are frequently used. The base resin is a thermoplastic elastomer, and includes one or more selected from among thermoplastic styrene, thermoplastic polyolefin, thermoplastic polyurethane, thermoplastic polyester elastomer, thermoplastic vulcanized elastomer, thermoplastic vinyl chloride elastomer, thermoplastic polyamide elastomer, and butyl rubber thermoplastic elastomer partially crosslinked by an organic peroxide, or a copolymer of them, or at least one of thermoplastic elastomers including a styrene-vinyl-isoprene block copolymer, or mixtures or copolymers of polypropylene and styrene elastomers.

For enhancing the thermal conductivity of the composite material 17, the heat dissipation filler 22 is mixed into the base resin 21. As the heat dissipation filler 22, there can be used boron nitride, aluminum oxide, and aluminum nitride as insulating ones. Besides, as the heat dissipation filler 22, there may also be used aluminum hydroxide, magnesium oxide, magnesium hydroxide, silicon oxide, zin oxide, silicon nitride, silicon carbide, diamond and the like. Conductive ones include carbon fiber, graphite, carbon nanotube, graphene, aluminum, copper and the like. In the case of using a conductive one, it is necessary to apply insulation coating thereto, or it is necessary to apply insulation coating to the side of a member, such as a circuit substrate, which is put in contact with the composite material 17. In addition, these heat dissipation fillers 22 may be used either singly or in combination of a plurality of kinds of them. Besides, the heat dissipation filler 22 may be subjected to a suitable surface treatment for enhancing interface adhesion between it and the resin. For example, in the case of using a silicone resin as the base resin 21 and aluminum oxide as the heat dissipation filler 22, they are mixed with each other after the filler is surface treated with a silane coupling agent. Note that in the case where circuit parts, electronic parts and the like possessed by the electronic apparatus 10, such as the imaging element 14, the control circuit 15, and the battery 16 are subjected to insulation coating, the material used as the heat dissipation filler 22 can be used without insulation coating thereof.

The heat dissipation filler 22 is a granular material obtained by putting together a plurality of scaly heat dissipation fillers. The average diameter of the granular heat dissipation filler 22 is preferably 100 μm or below, and more preferably 30 to 90 μm.

Besides, the hollow particles 23 are mixed into the base resin 21, in order to lighten (to lower the specific gravity of) the composite material 17. The hollow particles 23 are organic hollow particles in which air, a hydrocarbon or the like is sealed, and have solvent resistance. The average particle diameter of the hollow particles 23 is preferably 100 μm or below, and more preferably 30 to 60 μm.

Further, the bubbles 24 are formed in the base resin 21, in order to lighten (to lower the specific gravity of) the composite material 17. The bubbles 24 are formed by air or the like which is sealed in the base resin 21. As a method for forming the bubbles 24 (bubbling method), there can be used bubbling by volatilization of a solvent, a method utilizing heat-expandable microcapsules, a mechanical method, a chemical method and the like.

The bubbling by volatilization of a solvent is a method in which in the process of diluting the base resin 21 with a solvent and curing (solidifying) the composite material by drying, the solvent volatilizes after phase separation of the solvent, whereby bubbles are produced in the cured (solidified) composite material. As the solvent, there can be used organic solvents such as toluene, ethanol, and acetone. For example, in the case of using a silicone as the base resin, toluene is preferably used as the solvent, and, in the case of using an epoxy resin as the base resin, methyl cellosolve is preferably used as the solvent. It is preferable to use a solvent which is good in affinity for the base resin and which does not hamper heat curing of the base resin or adversely affect the physical properties of base resin. The amount of the solvent to be added is preferably up to approximately 40 vol % based on the base resin. An addition of the solvent in excess of this limit may hinder the heat curing of the base resin.

For example, as depicted in FIG. 2A, a silicone resin as the base resin 21 admixed with the heat dissipation filler and the hollow particles (not illustrated) is diluted with toluene as the solvent. By this, the viscosity of the base resin 21 can be lowered (viscosity lowering), and the interface adhesion between the base resin 21 and the heat dissipation filler 22 can be lowered (thermal conductivity enhancement). With the viscosity lowering contrived, filling of the electronic apparatus 10 with the composite material 17 is facilitated.

Further, when the base resin 21 diluted with toluene is heated, phase separation (variation in compatibility) between toluene and the base resin 21 is generated by a polymerization reaction, resulting in a sea-island structure. The sea-island structure is a structure in which one of a plurality of components is present in a continuous phase, while the other component or components are present in the state of being dispersed like islands. Normally, the islands as the disperse phase are discontinuous and have a minute particulate structure. In the present technology, toluene is present dispersedly in the base resin 21. When toluene volatilizes, bubbles are generated in sites where toluene has been present in the base resin 21. As a result, the composite material can be lightened (lowered in specific gravity). Note that in this case the individual bubbles constitute closed cells.

Note that as depicted in FIG. 2B, the base resin and the solvent may be in an interconnected structure or a layered structure, other than the sea-island structure. In the case where the base resin and the solvent are in the interconnected structure, volatilization of toluene results in that open cells in which a plurality of bubbles is connected are generated in sites where toluene has been present in the base resin 21.

The method utilizing heat-expandable microcapsules is a method utilizing heat-expandable microcapsules 50 which are spherical as depicted in FIG. 3A, and which each include a shell 51 and a hydrocarbon 52 involved in the shell 51 as depicted in FIG. 3B. The shells 51 of the heat-expandable microcapsules 50 include, for example, a thermoplastic resin having a film thickness of 2 to 15 μm, whereas the hydrocarbon 52 is a liquid hydrocarbon as an expanding agent. When the heat-expandable microcapsules 50 are gradually heated, the thermoplastic resin constituting the shells 51 is first softened, and, simultaneously, the hydrocarbon 52 expands through gasification, as illustrated in FIG. 3C. Therefore, when the heat-expandable microcapsules 50 are involved in the base resin 21 and a heating treatment thereof is conducted, the liquid hydrocarbon volatilizes and bubbles 53 are generated in the shells 51. In this method utilizing the heat-expandable microcapsules 50, the bubbles 53 are generated in the inside of the shells 51, and, therefore, the shells 51 are kept remaining in the base resin 21.

Figure 4A:
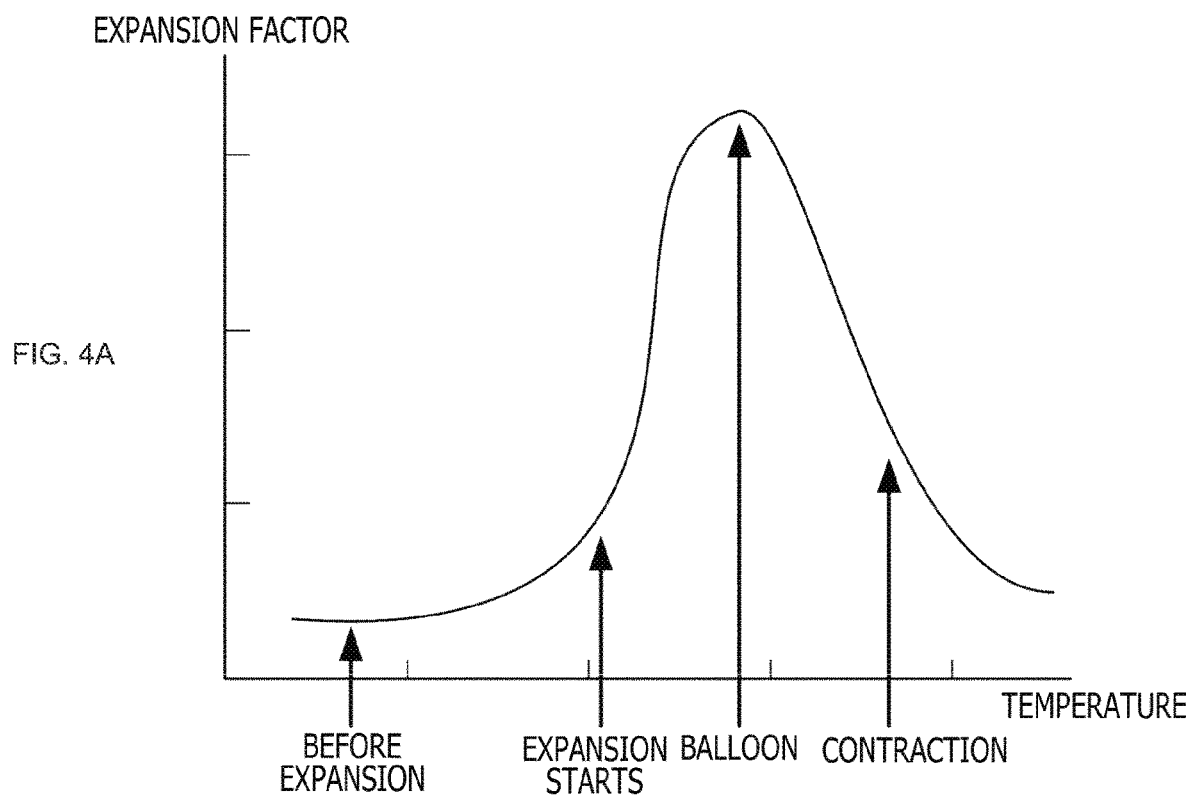
FIG. 4A is a graph depicting variation of the heat-expandable microcapsule by heating.
Figure 4B:
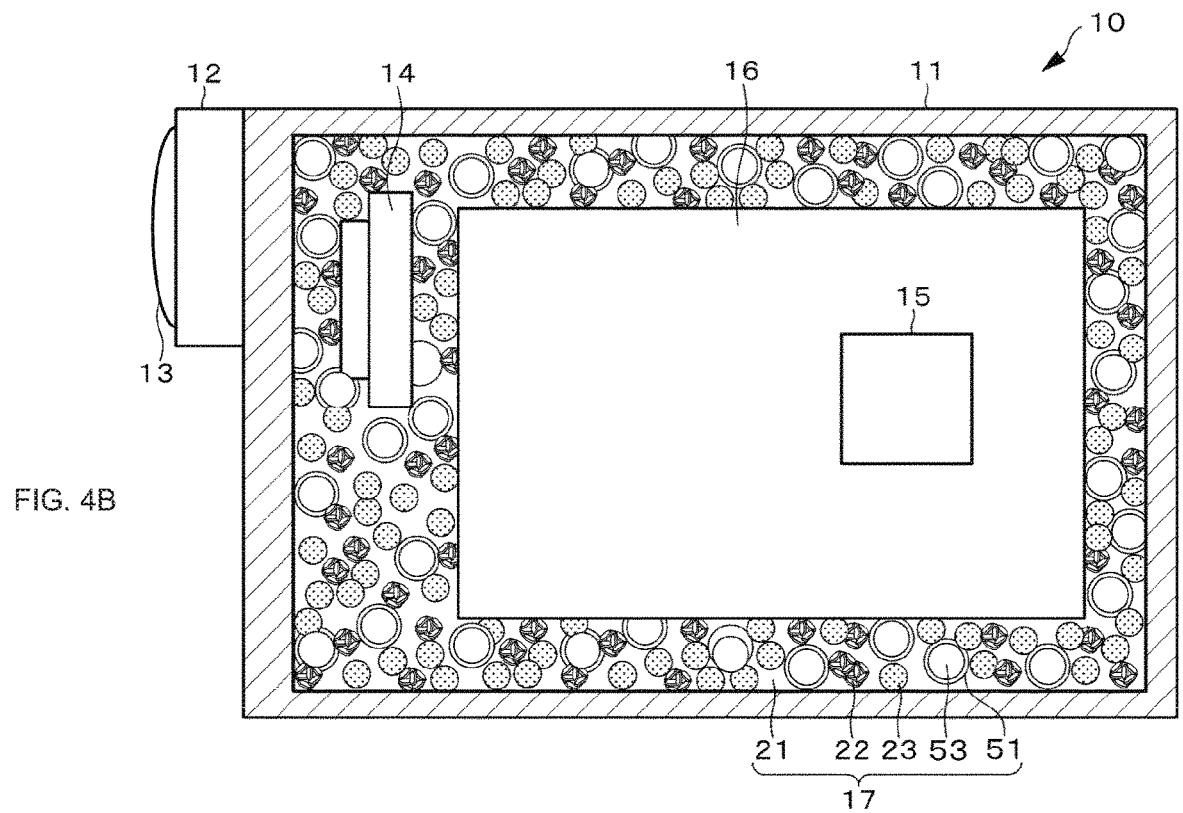
FIG. 4B is a figure depicting an example of the configurations of a composite material using heat-expandable microcapsules and an electronic apparatus.

In the case where the internal pressure of the heat-expandable microcapsule 50 and the tension of the shell 51 balance each other, the expanded state (balloon) is maintained. It is to be noted, however, that when the heating treatment is continued for a predetermined time or more, the gas is transmitted and diffused through the thinned shell 51, whereby the internal pressure is lowered and the heat-expandable microcapsule 50 contracts. A graph depicting the variation of the heat-expandable microcapsule 50 by the heating treatment is depicted in FIG. 4A. In addition, the composite material 17 in the case where the heat-expandable microcapsules 50 are mixed into the base resin 21 and the bubbles 53 are generated in the shells 51, and the electronic apparatus 10 filled with the composite material 17, are as illustrated in FIG. 4B.

Figure 5A:
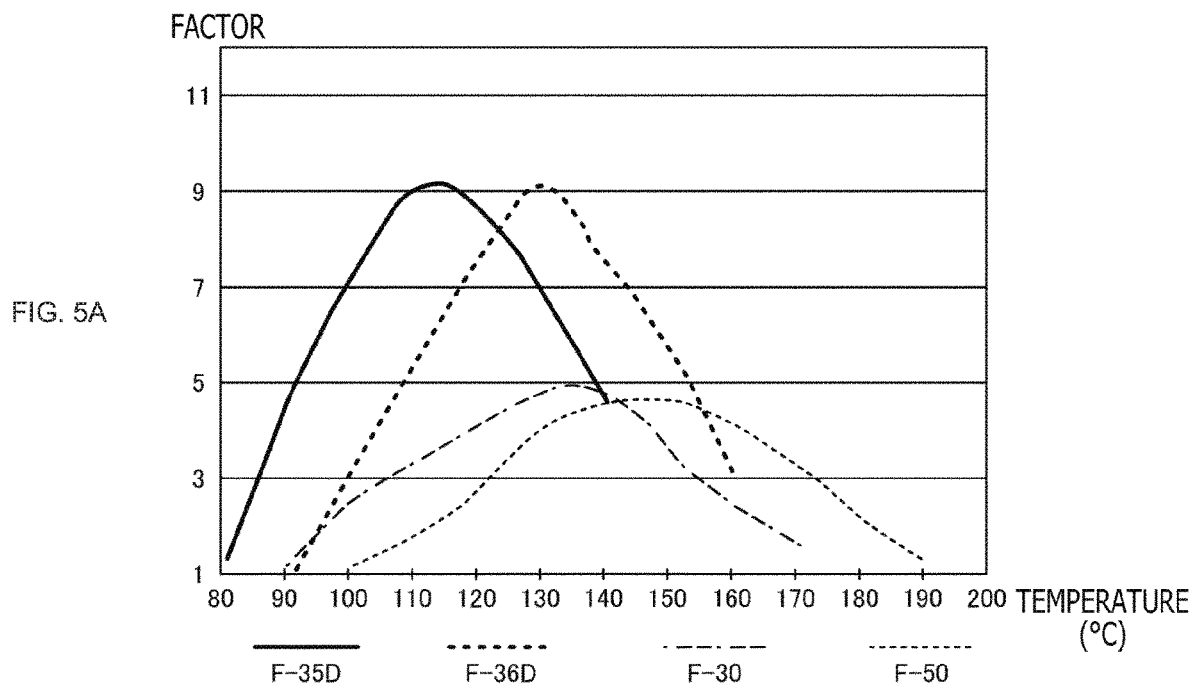
FIGS. 5A and 5B depict graphs depicting heating temperature and expansion ratio in regard of heat-expandable microcapsules used in the present embodiment.
Figure 5B:
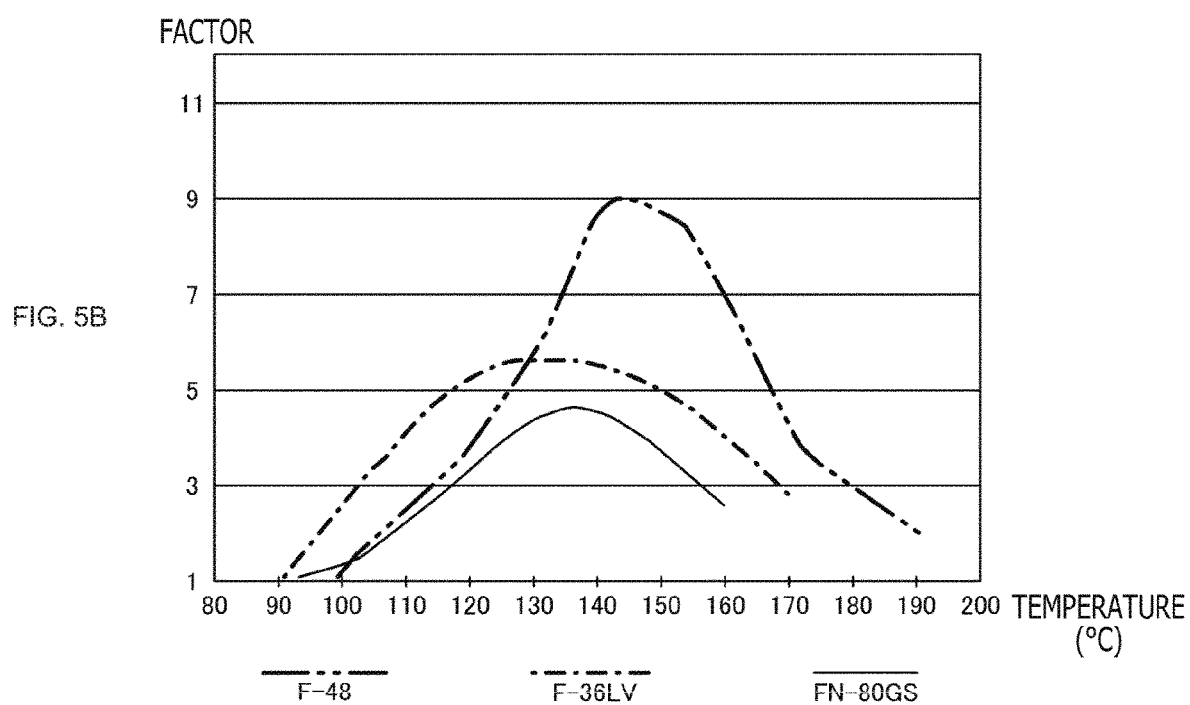

In addition, though the details will be described later, as depicted in graphs in FIGS. 5A and 5B, Matsumoto Microspheres (Matsumoto Yushi-Seiyaku Co., Ltd.: F-35D: average particle diameter 10 to 20 µm) as the heat-expandable microcapsules used in the present embodiment have an expansion start temperature of 70° C. to 80° C., and a maximum expansion temperature of 100° C. to 110° C. In addition, Matsumoto Microspheres (Matsumoto Yushi-Seiyaku Co., Ltd.: F-36D: average particle diameter 10 to 16 µm) have an expansion start temperature of 70° C. to 80° C., and a maximum expansion temperature of 110° C. to 120° C. Both F-35D and F-36D show bubbling to a certain extent at approximately 80° C. to 100° C. The heat-expandable microcapsules in the present technology are not limited to the Matsumoto Microspheres manufactured by Matsumoto Yushi-Seiyaku Co., Ltd.

The mechanical method is a method in which a gas component such as air and nitrogen is injected into the base resin, and bubbling is conducted by mechanical mixing to form the bubbles. Besides, the chemical method is a method in which cells are formed by a gas generated by pyrolysis of any of various bubbling agents, to effect bubbling, thereby forming the bubbles (cells).

The average particle diameter of the bubbles is preferably 1,000 µm or below, and more preferably 100 µm or below.

The composition (volume ratio) of the composite material is preferably 45 to 50 vol % of the base resin 21, 18 to 20 vol % of the heat dissipation filler 22, 30 to 35 vol % of the hollow particles 23, and 22 to 24 vol % of the bubbles 24.

Note that it is necessary for the composite material 17 to have an insulating property. This is because when a non-insulating composite material 17 having, for example, electrical conductivity or ionic conductivity makes contact with a metallic part of the control circuit 15 or the like, short-circuiting is caused. It is to be noted, however, that a non-insulating composite material may be used as the composite material if the composite material 17 does not make contact with a metallic part of the control circuit 15 or the like. Therefore, in the case where the control circuit 15 and the like are coated with a thin insulating material or are covered by an insulating case or the like, a non-insulating composite material may be used without insulation coating thereof.

Note that the composite material 17 may be configured such that it is cured (solidified) after placed to fill the housing 11 and can be removed (has a reworkability) after curing (solidification). In addition, the composite material may include the base resin, the heat dissipation filler mixed into the base resin, the shells mixed into the base resin, and the bubbles produced in the shells, or may include the base resin, the heat dissipation filler mixed into the base resin, and the hollow particles mixed into the base resin.

1-3. Method for Filling with Composite Material

Figure 6:
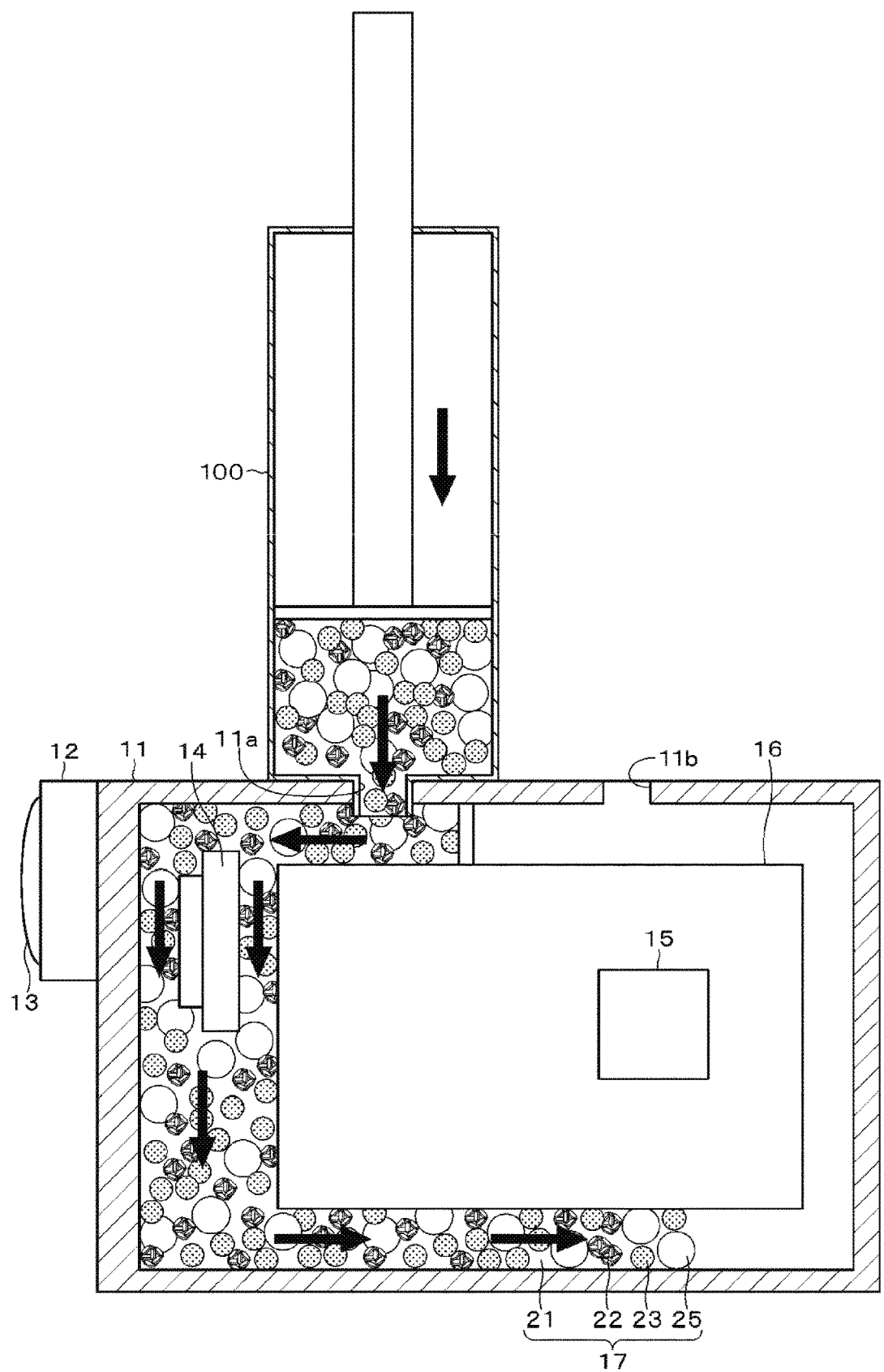
FIG. 6 is a figure depicting a method for filling a housing with a composite material.

A method for filling the electronic apparatus 10 with the composite material 17 will be described below, referring to FIG. 6. The housing 11 of the electronic apparatus 10 is configured to be high in hermetic sealing property, and is provided with an injection port 11a and an air hole 11b. The air hole 11b is preferably provided with a check valve structure.

A tip of an injector 100 such as a syringe with the composite material 17 sealed therein is connected to the injection port 11a, and a piston of the injector 100 is pushed out, to gradually fill the housing 11 with the composite material 17 supplied from within the injector 100. In this instance, air inside the housing 11 is sucked out through the air hole 11b by a vacuum pump or the like, whereby the composite material 17 can be efficiently injected into the housing 11. After the housing 11 is filled with the whole of a predetermined amount of the composite material 17, the injection port 11a and the air hole 11b are closed. Note that at the time of injection, the composite material 17 is not yet cured (solidified), and, therefore, bubbles 24 are not yet formed, and the base resin 21 is in the state of being diluted with a solvent 25.

The electronic apparatus 10 filled with the composite material 17 is left to stand in an environment of room temperature to 100° C. for several hours, preferably in an environment of room temperature to 60° C. for several minutes, whereby the composite material 17 is cured (solidified).

Note that a method may be used in which the injector 100 is not used, but a container with the composite material 17 preliminarily sealed therein is set to the injection port 11a, and air inside the housing 11 is sucked out through the air hole 11b by a vacuum pump, to suck the composite material 17 out of the container, thereby filling the housing 11 with the composite material 17.

A terminal part of the battery 16, a terminal part of the storage medium, a communication terminal and the like parts with which the composite material 17 should not make contact are preferably covered preliminarily with caps, cases or the like formed of an insulating material. In addition, since it is necessary to prevent the composite material 17 from entering the inside of a lens-barrel (a path of light) possessed by the optical imaging system 12, it is also necessary to cover the lens-barrel with a cap or the like. If the composite material enters the lens-barrel, light may be shielded by the composite material 17, and imaging cannot be performed.

Besides, while the battery 16 may make direct contact with the composite material 17, if a battery case in which to accommodate the battery 16 inside the housing 11 is filled with the composite material 17, the battery case cannot accommodate the battery 16. Therefore, in the case of providing a battery case inside the housing 11, it is recommendable to preliminarily provide a body of the same shape as the battery 16 in the battery case, such that the battery case is not filled with the composite material 17. After filling with the composite material 17, the body is removed, whereby the battery 16 can be accommodated in the battery case. Note that direct contact of the composite material 17 with the battery 16 ensures a high temperature rise preventing effect.

The inside of the housing 11 is preferably provided with a structure which can easily be filled with the composite material 17, such as a structure in which there are few branches of flow paths for the composite material 17 or a structure in which there are few thin flow paths.

In addition, the housing 11 may be provided therein with a reverse flow preventive wall for preventing reverse flow of the composite material 17.

Note that in the case of forming the bubbles 24 by volatilization of a solvent, the housing 11 is preferably provided with a plurality of holes as vents for volatilization of the solvent.

1-4. Method for Disposing Composite Material

Other than the filling of the electronic apparatus 10 with the composite material 17 by injection, it is possible to dispose the composite material 17 in a solid state in the electronic apparatus 10, or to provide the composite material 17 by placing it on a component part in the electronic apparatus 10.

First, as depicted in FIGS. 7A, 7B, and 7C, the composite material 17 is molded such as to conform to the shape of the inside of the housing 11 by any of various molding methods. Examples of the molding method include cast molding depicted in FIG. 7A, extrusion depicted in FIG. 7B, and injection molding depicted in FIG. 7C.

In the cast molding, first, a mold 210 of the same shape as the internal shape of the housing 11 is preliminarily prepared, the composite material 17 having fluidity before curing (solidification) is poured into the mold 210, and is cured (solidified) by heating of one liquid or by mixing or heating of two liquids. The curing (solidification) condition is, for example, several hours in an environment of room temperature to 100° C., preferably several minutes in an environment of room temperature to 60° C.

The cured (solidified) composite material 17 is detached from the mold, and is provided in such a manner as to fit it into the internal shape of the housing 11 in the manufacturing process of the electronic apparatus 10.

In the extrusion, a pressure-resistant mold 220 is preliminarily prepared, the composite material 17 having fluidity is placed in the mold 220, and a high pressure is exerted to push out the composite material 17 through a minute gap having a fixed sectional shape of the mold 220, to obtain the composite material 17 conforming to the internal shape of the housing 11. Note that the method and condition for curing (solidification) of the composite material 17 are similar to the cast molding described above. Then, the cured (solidified) composite material 17 is provided in such a manner as to fit it into the internal shape of the housing 11 in the manufacturing process of the electronic apparatus 10.

In the injection molding, an injection unit 230 such as a cylinder is filled with the composite material 17 having fluidity, and the composite material 17 is injection molded into a high-temperature mold 240 having a shape conforming to the internal shape of the housing 11, thereby curing (solidifying) and molding. Note that the method and condition for curing (solidification) of the composite material 17 are similar to the cast molding described above. Then, the cured (solidified) composite material 17 is provided in such a manner as to fit it to the internal shape of the housing 11 in the manufacturing process of the electronic apparatus 10.

As aforementioned, a method may be adopted in which the composite material 17 is preliminarily cured (solidified) and thereafter the cured (solidified) composite material 17 is fitted in position in the manufacturing process of the electronic apparatus 11. According to this method, the composite material 17 can be provided only in a specified site in the housing 11 of the electronic apparatus 10 and in a specified range. Therefore, it is also possible to permit the composite material 10 to make contact only with specified parts while avoiding those parts in the electronic apparatus 10 with which the composite material 10 should not make contact.

Note that cast molding, extrusion, and injection molding have been mentioned as examples of the molding method, the molding method is not limited to them. Any method may be used insofar as the composite material 17 can be cured (solidified) in a shape conforming to the internal shape of the housing 11, before the manufacturing process of the electronic apparatus 10.

In the case of using the heat-expandable microcapsules for forming the bubbles in the base resin 21, the bubbles are produced by heating the composite material 17 at the stage of this molding. As a result, a heat treatment for producing the bubbles may not necessarily be conducted after the composite material 17 is provided in the electronic apparatus 10, and, therefore, thermal damage would not be given to the electronic apparatus 10. In addition, the absence of need to heat the electronic apparatus 10 as a whole for producing the bubbles means the absence of limitations as to the temperature of the heating treatment for producing the bubbles, and, therefore, a high-temperature heating treatment can be performed.

1-5. Production of Composite Material and Comparison of Physical Properties

The results of producing the composite materials by way of trial and comparing them with commercially available potting materials, heat dissipation sheets, and foamed heat dissipation materials serving as comparative examples will be described below. As the composite materials, two kinds of ones, namely, a first composite material and a second composite material were produced. First, the first composite material was produced by use of the following materials.

Base resin: silicone resin (Shin-Etsu Silicone: KE-1013)

Heat dissipation filler: granular BN (Momentive: PTX60: D50=60 μm)

Unexpanded hollow particles (Heat-expandable microcapsules): Matsumoto Microspheres (Matsumoto Yushi-Seiyaku Co., Ltd.: F-35D: average particle diameter 10 to 20 μm, F-36D: average particle diameter 10 to 16 μm)

Solvent: toluene (Kanto Chemical Co., Inc.: 40180-00)

Required amounts of the above-mentioned materials were weighed by an electronic balance, were placed in a vessel, and were lightly mixed by a spatula, followed by mixing by a planetary centrifugal mixer. The viscosity of the resulting solution was measured by a rotational viscometer, the solution was poured into an aluminum frame sized to 50 mm by 50 mm by 1 mm placed on a release sheet, the assembly was sandwiched between the release sheets, was subjected to molding by roller from above, and was cured (solidified) by a heat treatment in a thermostat at 150° C. for 30 minutes. In this instance, toluene volatilizes and bubbles are generated. Thermal conductivity was measured by a thermal resistance measuring instrument (according to ASTM D5470).

The second composite material was produced by use of the following materials.

Base resin: silicone resin (Shin-Etsu Silicone: KE-1013)

Heat Dissipation filler: granular BN (Denka Company Limited: FP40: D50=40 μm)

Expanded hollow particles: Expancel (Japan Fillite Co., Ltd.: 920DE40d30: average particle diameter 35 to 55 μm)

Solvent: toluene (Kanto Chemical Co., Inc.: 40180-00)

A low-viscosity silicone resin was used as the base resin, and granular BN particles (depicted in FIG. 8A) were used as the heat dissipation filler. Minute thermoplastic resin spheres called Expancel were used as hollow capsules. Expancel has a hydrocarbon gas involved in shells of a thermoplastic resin, such that when heated the internal gas pressure increases, and the thermoplastic resin shells are softened, with the volume of the shells being expanded by a factor of several tens. While Expancel includes an unexpanded type and an expanded type, the type preliminarily expanded to an average particle diameter of 35 to 55 μm was used (depicted in FIG. 8B).

Required amounts of the above-mentioned materials were weighed by an electronic balance, were placed in a vessel, and were lightly mixed by a spatula, followed by mixing by a planetary centrifugal mixer. After the viscosity of the resulting solution was measured by a rotational viscometer, the solution was poured into an aluminum frame sized 50 mm by 50 mm by 1 mm placed on a release sheet, the assembly was sandwiched between the release sheets, was subjected to roller molding from above, and was cured (solidified) by a heat treatment in a thermostat at 80° C. for one hour. Thermal conductivity was measured by a thermal resistance measuring instrument (according to ASTM D5470).

For both the first composite material and the second composite material, mixing was conducted using the following device. In addition, viscosity measurement and thermal conductivity measurement were performed using the following instruments.

Mixing: Super Mixer Awatori (bubble removal) Rentaro (Thinky Corporation: ARE-310)

Viscosity measurement: rotational viscometer (Brookfield: RVDV-I+)

Further, other than the aforementioned heat dissipation filler (granular BN (Denka Company Limited: FP40)), the following materials were also used as the heat dissipation filler in producing the composite materials.

(1) Heat dissipation filler: scaly BN (Showa Denko K.K.: UHP-1K: D50=8 μm)

(2) Heat dissipation filler: scaly BN (Momentive: PT140: D50=9 to 12 μm)

(3) Heat dissipation filler: granular BN (Denka Company Limited: FP70: D50=70 μm)

(4) Heat dissipation filler: scaly BN (Momentive: PTX25: D50=25 μm)

The measurement results are depicted in FIGS. 10 and 11. The graph in FIG. 11 is an enlarged presentation of a part of the graph in FIG. 10. In the graphs in FIGS. 10 and 11, the solid symbols represent the composite materials according to the present embodiment, produced from a silicone resin (Shin-Etsu Silicone: KE-1013) as the base resin, Expancel (Japan Fillite Co., Ltd. 920DE40d30) as expanded hollow particles, granular BN (Denka Company Limited: FP40) as the heat dissipation filler, and toluene as the solvent for producing bubbles. Table 1 depicts combinations of volume ratios of the composite materials, together with the viscosity, specific gravity, and thermal conductivity thereof.

TABLE 1

|  | silicone resin KE-1013 | organic hollow particle 920DE40d30 | heat dissipation filler BN FP40(granular) | toluene | viscosity [Pa·s] | specific gravity [g/cm$^3$] | thermal conductivity [W/m·K] | curable [80° C., 2 hrs] |
|---|---|---|---|---|---|---|---|---|
| (1) | 55 vol % | 30 vol % | 15 vol % | — | unmeasurable | 0.873 | 0.749 | o |
| (2) | 55 vol % | 30 vol % | 15 vol % | +31 vol % | 25 | 0.716 | 0.820 | o |
| (3) | 55 vol % | 30 vol % | 15 vol % | +19 vol % | 63 | 0.824 | 0.732 | o |
| (4) | 25 vol % | 55 vol % | 20 vol % | +73 vol % | 2.2 | — | — | x not cured |
| (5) | 30 vol % | 60 vol % | 10 vol % | — | unmeasurable | 0.54 | 0.416 | o |
| (6) | 30 vol % | 60 vol % | 10 vol % | +24 vol % | 67 | 0.442 | 0.402 | o |
| (7) | 35 vol % | 45 vol % | 20 vol % | +24 vol % | 83 | 0.755 | 0.900 | o |
| (8) | 50 vol % | 30 vol % | 20 vol % | +24 vol % | 42 | 0.724 | 1.062 | o |
| (9) | 45 vol % | 35 vol % | 20 vol % | +22 vol % | 77 | 0.731 | 0.987 | o |
| (10) | 50 vol % | 32 vol % | 18 vol % | +24 vol % | 63 | 0.755 | 1.055 | o |
| (11) | 50 vol % | 32 vol % | 18 vol % | +36 vol % | 35 | 0.708 | 0.874 | o |
|  | 50 vol % | 32 vol % | 18 vol % | +36 vol % | 35 | 0.653 | 0.792 | o |
|  | 50 vol % | 32 vol % | 18 vol % | +36 vol % | 35 | 0.699 | 0.859 | o |

Thermal conductivity measurement: thermal resistance measuring instrument (according to ASTM D5470)

For both the first composite material and the second composite material, the thermal resistance measuring instrument was one that performs measurement by a temperature gradient method, as depicted in FIG. 9.

In addition, in the graphs in FIGS. 10 and 11, the solid-line void symbols represent the measurement results of composite materials (solvent not used) each including a silicone resin, hollow particles, and a heat dissipation filler (scaly or granular). Tables 2 to 6 depict combinations of volume ratios of the composite materials, together with the viscosity, specific gravity, and thermal conductivity thereof.

TABLE 2

|  | silicone resin KE-1013 | organic hollow particle 920DE40d30 | heat dissipation filler BN UHP-1K | viscosity [Pa·s] | specific gravity [g/cm$^3$] | thermal conductivity [W/m·K] |
|---|---|---|---|---|---|---|
| 1 | 100 vol % | 0 vol % | 0 vol % | 0.35 | 0.97 | 0.179 |
| 2 | 90 vol % | 10 vol % | 0 vol % | 0.6 | 0.876 | 0.163 |
| 3 | 80 vol % | 20 vol % | 0 vol % | 0.85 | 0.782 | 0.147 |
| 4 | 70 vol % | 30 vol % | 0 vol % | 1.1 | 0.688 | 0.131 |
| 5 | 60 vol % | 40 vol % | 0 vol % | 1.5 | 0.594 | 0.122 |
| 6 | 50 vol % | 50 vol % | 0 vol % | 5.2 | 0.5 | 0.111 |
| 7 | 40 vol % | 60 vol % | 0 vol % | 30 | 0.406 | 0.093 |
| 8 | 90 vol % | 0 vol % | 10 vol % | 2 | 1.1 | 0.439 |
| 9 | 80 vol % | 10 vol % | 10 vol % | 3.9 | 1.006 | 0.45 |
| 10 | 70 vol % | 20 vol % | 10 vol % | 7.0 | 0.912 | 0.466 |
| 11 | 60 vol % | 30 vol % | 10 vol % | 20 | 0.818 | 0.415 |
| 12 | 50 vol % | 40 vol % | 10 vol % | 60 | 0.724 | 0.416 |

TABLE 2-continued

|    | silicone resin KE-1013 | organic hollow particle 920DE40d30 | heat dissipation filler BN UHP-1K | viscosity [Pa·s] | specific gravity [g/cm³] | thermal conductivity [W/m·K] |
|----|------|------|------|------|------|------|
| 13 | 40 vol % | 50 vol % | 10 vol % | 376 | 0.63 | 0.432 |
| 14 | 30 vol % | 60 vol % | 10 vol % | unmeasurable | 0.536 | 0.434 |
| 15 | 80 vol % | 0 vol % | 20 vol % | 36 | 1.23 | 0.844 |
| 16 | 70 vol % | 10 vol % | 20 vol % | 60 | 1.136 | 0.863 |
| 17 | 60 vol % | 20 vol % | 20 vol % | unmeasurable | 1.042 | 0.953 |
| 18 | 50 vol % | 30 vol % | 20 vol % | unmeasurable | 0.948 | 0.992 |
| 19 | 75 vol % | 0 vol % | 25 vol % | unmeasurable | 1.295 | 1.092 |
| 20 | 65 vol % | 10 vol % | 25 vol % | unmeasurable | 1.201 | 1.078 |

TABLE 3

|   | silicone resin KE-1013 | organic hollow particle 920DE40d30 | heat dissipation filler BN PT140 (scaly) | viscosity [Pa·s] | specific gravity [g/cm³] | thermal conductivity [W/m·K] |
|---|------|------|------|------|------|------|
| 1 | 70 vol % | 10 vol % | 20 vol % | 40 | 1.162 | 0.819 |

TABLE 4

|   | silicone resin KE-1013 | organic hollow particle 920DE40d30 | heat dissipation filler BN FP40(granular) | viscosity [Pa·s] | specific gravity [g/cm³] | thermal conductivity [W/m·K] |
|---|------|------|------|------|------|------|
| 1 | 30 vol % | 60 vol % | 10 vol % | unmeasurable | 0.546 | 0.416 |
| 2 | 70 vol % | 10 vol % | 20 vol % | 62 | 1.131 | 1.182 |
| 3 | 67 vol % | 15 vol % | 18 vol % | 120 | 1.001 | 1.036 |
| 4 | 60 vol % | 25 vol % | 15 vol % | several hundreds | 0.887 | 0.586 |
| 5 | 55 vol % | 30 vol % | 15 vol % | unmeasurable | 0.873 | 0.749 |
| 6 | 75% vol | 0% vol | 25% vol | 200 | 1.317 | 1.219 |
| 7 | 70% vol | 0% vol | 30% vol | unmeasurable | 1.295 | 1.6 |

TABLE 5

|   | silicone resin KE-1013 | organic hollow particle 920DE40d30 | heat dissipation filler BN FP70 (granular) | viscosity [Pa·s] | specific gravity [g/cm³] | thermal conductivity [W/m·K] |
|---|------|------|------|------|------|------|
| 1 | 70 vol % | 10 vol % | 20 vol % | 44 | 1.111 | 1.217 |
| 2 | 67 vol % | 15 vol % | 18 vol % | 40 | 1.041 | 1.022 |

TABLE 6

|   | silicone resin KE-1013 | organic hollow particle 920DE40d30 | heat dissipation filler BN PTX25(granular) | viscosity [Pa·s] | specific gravity [g/cm³] | thermal conductivity [W/m·K] |
|---|------|------|------|------|------|------|
| 1 | 30 vol % | 60 vol % | 10 vol % | unmeasurable | 0.546 | 0.433 |
| 2 | 70 vol % | 10 vol % | 20 vol % | unmeasurable | 1.132 | 1.164 |

Besides, in the graphs in FIGS. 10 and 11, broken-like symbols represent commercially available potting materials as comparative examples. Table 7 depicts combinations of volume ratios of the commercially available potting materials, together with the viscosity, specific gravity, and thermal conductivity thereof.

TABLE 7

|  |  | measured value thermal conductivity [W/m · K] | measured value specific gravity [g/cm³] |
|---|---|---|---|
| potting material | TIA207GN | 0.625 | 1.648 |
|  | TIA216G | 1.619 | 2.766 |
|  | RV087 | 1.446 | 2.866 |
|  | RV089 | 0.757 | 1.746 |
|  | CGW-3 | 2.877 | 2.79 |
|  | UF1113 | 0.591 | 1.517 |

In addition, in the graphs in FIGS. 10 and 11, the symbols drawn in alternate long and two short dashes line and the crossed symbols represent commercially available heat dissipation sheets as comparative examples. Table 8 depicts combinations of volume ratios of the commercially available heat dissipation sheets, together with the viscosity, specific gravity, and thermal conductivity thereof.

TABLE 8

|  |  | measured value thermal conductivity [W/m · K] | measured value specific gravity [g/cm³] |
|---|---|---|---|
| heat dissipation sheet | TMS-14-10 | 1.318 | 2.32 |
|  | TMS-22-10 | 1.919 | 2.96 |
|  | FSL-100BS | 1.95 | 2.741 |
|  | FSL-100HS | 3.83 | 3.049 |

Besides, in the graphs in FIGS. 10 and 11, the symbol consisting of a hatched circle represents a commercially available foamed heat dissipation material as a comparative example. Table 9 depicts a combination of volume ratios of the commercially available foamed heat dissipation material, together with the viscosity, specific gravity, and thermal conductivity thereof.

TABLE 19

|  |  | measured value thermal conductivity [W/m · K] | measured value specific gravity [g/cm³] |
|---|---|---|---|
| foamed heat dissipation material | XLIM-CL07 | 0.286 | 0.7 |

Further, in the graphs in FIGS. 10 and 11, the solid-line symbol x represents the aforementioned first composite materials, produced from a silicone resin (Shin-Etsu Silicone: KE-1013) as the base resin, Matsumoto Microspheres (Matsumoto Yushi-Seiyaku Co., Ltd.: F-35D, F-36D) as unexpanded hollow particles (heat-expandable microcapsules), granular BN (Momentive: PTX60) as the heat dissipation filler, and toluene as the solvent for producing bubbles. Tables 10 and 11 depict combinations of volume ratios of the first composite materials, together with the viscosity, specific gravity, and thermal conductivity thereof. Table 10 is a table depicting the results in the case of using Matsumoto Microspheres (Matsumoto Yushi-Seiyaku Co., Ltd.: F-35D), and Table 11 is a table depicting the results in the case of using Matsumoto Microspheres (Matsumoto Yushi-Seiyaku Co., Ltd.: F-36D).

TABLE 10

|  | silicon resin KE-1013 | heat dissipation filler BN, PTX60 | organic hollow particle F-35D(unexpanded) | solvent toluene | bubbling factor [%] | viscosity [Pa · s] | specific gravity [g/cm³] | thermal conductivity [W/m · K] |
|---|---|---|---|---|---|---|---|---|
| ① | 80 vol % | 20 vol % | +20 vol % | +5 vol % | +49 | 23 | 0.826 | 1.029 |
| ② | 80 vol % | 20 vol % | +20 vol % | +10 vol % | +48 | 15 | 0.831 | 1.241 |
| ③ | 80 vol % | 20 vol % | +40 vol % | +10 vol % | +51 | 18 | 0.812 | 1.041 |
| ④ | 71 vol % | 29 vol % | +20 vol % | +1 vol % | +133 | 50 | 0.578 | 0.824 |
| ⑤ | 71 vol % | 29 vol % | +20 vol % | +5 vol % | +85 | 40 | 0.727 | 0.997 |
| ⑥ | 71 vol % | 29 vol % | +20 vol % | +10 vol % | +67 | 20 | 0.808 | 1.230 |

TABLE 11

|  | silicon resin KE-1013 | heat dissipation filler BN, PTX60 | organic hollow particle F-35D(unexpanded) | solvent toluene | bubbling factor [%] | viscosity [Pa · s] | specific gravity [g/cm³] | thermal conductivity [W/m · K] |
|---|---|---|---|---|---|---|---|---|
| ① | 80 vol % | 20 vol % | +20 vol % | +10 vol % | +47 | 13 | 0.836 | 1.200 |
| ② | 80 vol % | 20 vol % | +20 vol % | +20 vol % | +61 | 80 | 0.766 | 1.140 |
| ③ | 80 vol % | 20 vol % | +20 vol % | +30 vol % | +107 | 2.8 | 0.594 | 0.822 |
| ④ | 75 vol % | 23 vol % | +20 vol % | +25 vol % | +106 | 7.8 | 0.615 | 0.984 |
| ⑤ | 75 vol % | 23 vol % | +20 vol % | +25 vol % | +97 | 7.6 | 0.657 | 1.051 |
| ⑥ | 75 vol % | 25 vol % | +20 vol % | +20 vol % | +61 | 13 | 0.806 | 1.472 |
| ⑦ | 75 vol % | 25 vol % | +20 vol % | +20 vol % | +51 | 13 | 0.856 | 1.358 |
| ⑧ | 75 vol % | 25 vol % | +20 vol % | +30 vol % | +131 | 8.6 | 0.560 | 0.957 |
| ⑨ | 75 vol % | 25 vol % | +20 vol % | +30 vol % | +87 | 5.6 | 0.694 | 1.209 |

Figure 12B:
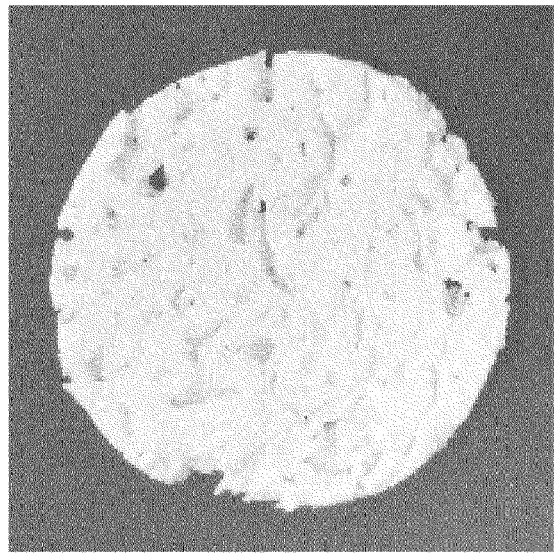
FIGS. 12A and 12B depict photographs depicting open cells in a composite material according to the present embodiment.
Figure 12A:
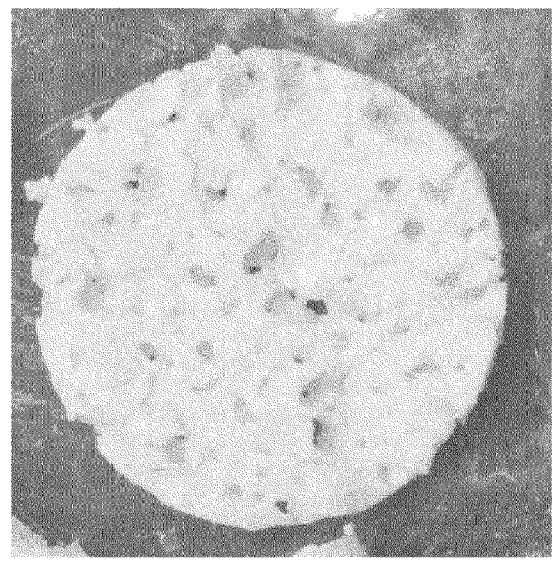

Note that in the composite material of 4 in Table 11, open cells as depicted in FIG. 12A are formed. In addition, in the composite material of 8 in Table 11, open cells as depicted in FIG. 12B are formed. From FIGS. 12A and 12B, it can be conformed that the bubbles (cells) are not closed cells but open cells.

Figure 13B:
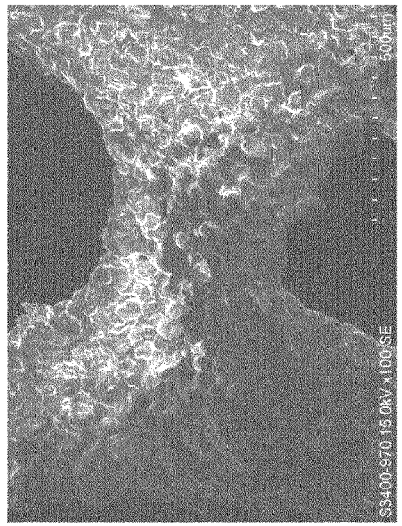
FIGS. 13A, 13B, 13C, and 13D depict photographs depicting open cells in a composite material according to the present embodiment.
Figure 13D:
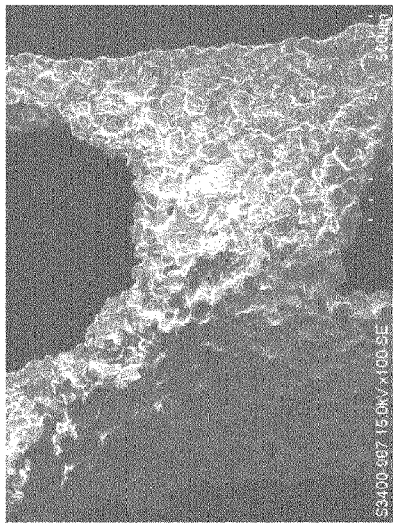
Figure 13A:
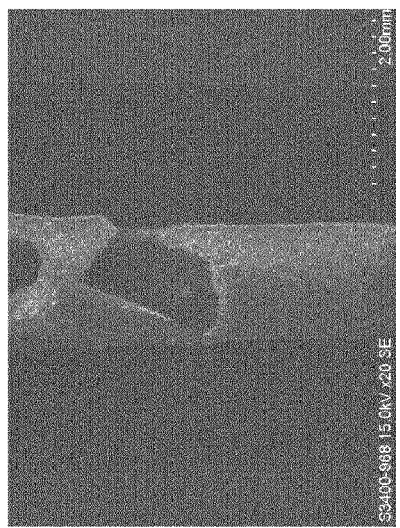
Figure 13C:
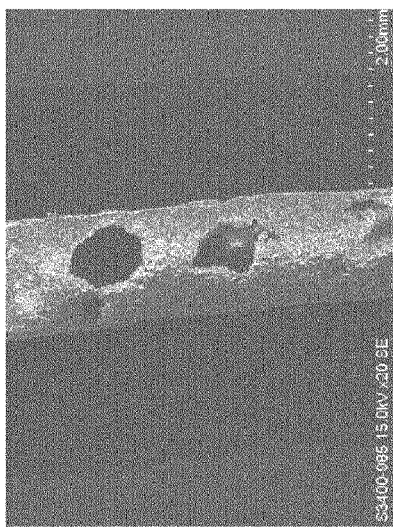

Besides, FIGS. 13A and 13B are enlarged photographs of a section of the composite material of (5) in Table 11. Further, FIGS. 13C and 13D are enlarged photographs of a section of the composite material of (9) in Table 11. In both cases, it is seen that the bubbles (cells) are not fine cells but large open cells.

An example of the case of using expanded hollow particles is depicted below. This example corresponds to composite materials according to the present embodiment, produced from a silicone resin (Shin-Etsu Silicone: KE-1013) as the base resin, Expancel (Japan Fillite Co., Ltd.: 920DE40d30) as expanded hollow particles, granular BN (Momentive: PTX60) as the heat dissipation filler, and toluene as the solvent for producing bubbles. Table 12 depicts combinations of volume ratios of the composite materials, together with the viscosity, specific gravity, and thermal conductivity thereof.

TABLE 12

| | silicone resin KE-1013 | organic hollow particle 920DE40d30 | heat dissipation filler BN, PTX25 (granular) | solvent toluene | viscosity [Pa · s] | specific gravity [g/cm³] | thermal conductivity [W/m · K] |
|---|---|---|---|---|---|---|---|
| ① | 67 vol % | 15 vol % | 18 vol % | — | several hundreds | 0.992 | 1.174 |
| ② | 60 vol % | 30 vol % | 20 vol % | +36 vol % | 100 or more | 0.635 | 1.041 |

Figure 14B:
FIGS. 14A and 14B depict photographs depicting a composite material in which toluene is not used.
Figure 14A:
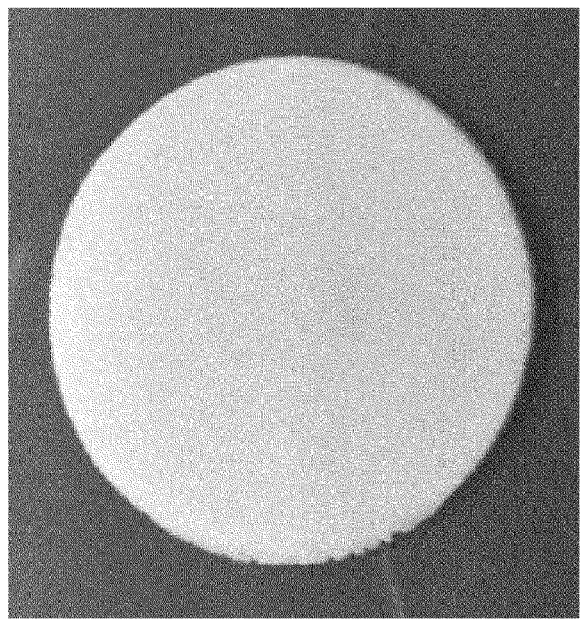

Note that in the composite material of 1 in Table 12 in which toluene was not used, the sheet surface is smooth as depicted in FIG. 14A. In addition, in the composite material of 2 in Table 12 in which toluene was used, the sheet surface is rugged as depicted in FIG. 14B.

Figure 15B:
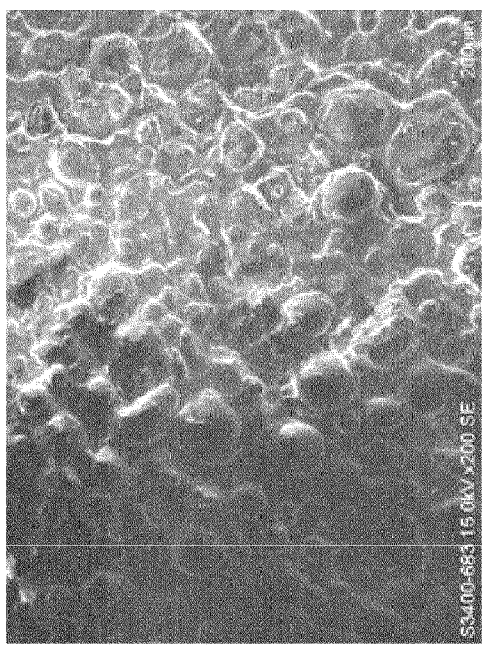
FIGS. 15A, 15B, 15C, and 15D depict enlarged photographs of a section of a composite material.
Figure 15D:
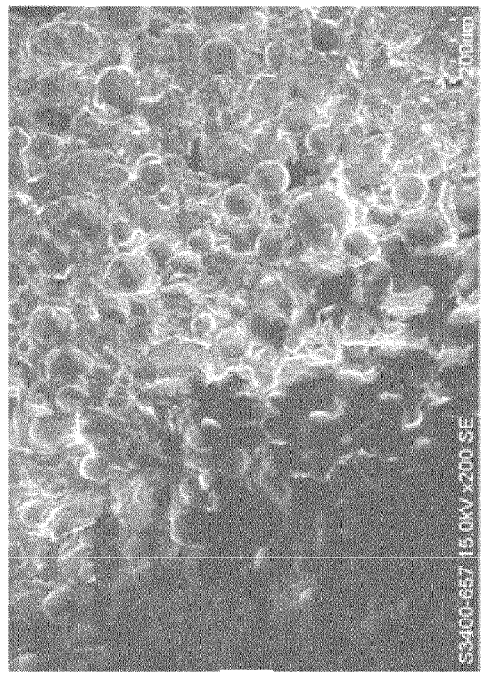
Figure 15A:
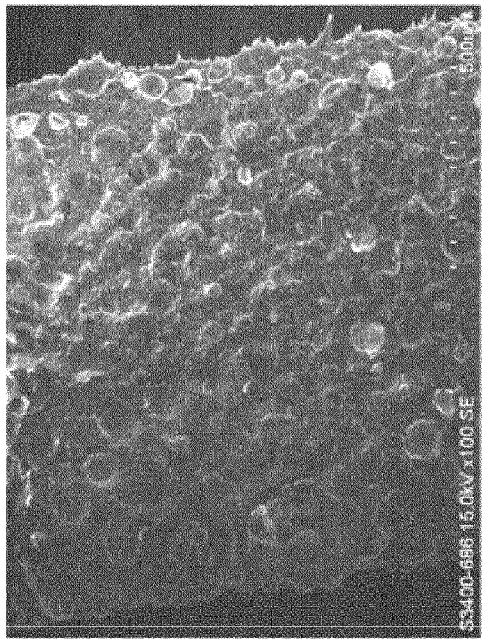
Figure 15C:
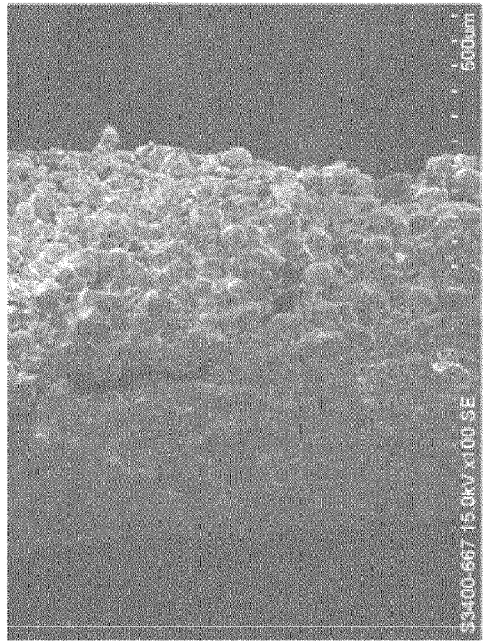

In addition, FIGS. 15A and 15B are enlarged photographs of a section of the composite material of 1 in Table 12. It is seen that the base resin is filled with expanded hollow particles and granular BN, in high densities without gaps. On the other hand, FIGS. 15C and 15D are enlarged photographs of a section of the composite material of 2 in Table 12. It is seen that, due to volatilization of toluene, a multiplicity of voids are formed between expanded hollow particles and granular BN, and open cells are formed.

As aforementioned, it is preferable that the composite material is low in specific gravity and high in thermal conductivity. Thus, in the present embodiment, a specific gravity of not more than 0.7 and a thermal conductivity of not less than 1 are target values.

The commercially available potting materials are higher in specific gravity than the composite materials according to the present technology. Besides, the commercially available foamed heat dissipation materials are comparable in specific gravity to the composite materials according to the present technology, but are lower in thermal conductivity than the composite materials according to the present technology. In addition, the commercially available heat dissipation sheets are high in thermal conductivity but high in specific gravity. In contrast, the composite materials according to the present technology can be composite materials which are low in specific gravity and high in thermal conductivity.

Of the volume ratios of the composite materials according to the present embodiment set forth in Table 1, those of the composite materials (8), (9), and (10) are most approximate to the target values of a specific gravity of not more than 0.7 and a thermal conductivity of not less than 1. From these results, an optimal volume ratio for the base resin, the hollow particles, the heat dissipation filler, and the solvent can be obtained.

In the present technology, the base resin is filled therein with the hollow particles, the bubbles, and the heat dissipation filler, whereby it is possible to realize a composite material being light (low in specific gravity) and high in thermal conductivity. In addition, in producing the composite material, the base resin is diluted with the solvent, whereby it is possible to lower the viscosity (lowering in viscosity) and to lower the interface thermal resistance between the base resin and the heat dissipation filler (thermal conductivity enhancement). Further, with the bubbles (cells) formed in the cured (solidified) composite material, it is possible to make the composite material further lighter (lowering in specific gravity).

With the composite material disposed to fill the inside of the housing 11 of the electronic apparatus and gaps between the electronic parts, it is possible to efficiently transfer the heat generated in the inside of the electronic apparatus and at the electronic parts, thereby dissipating the heat. As a result, rises in the temperature inside the electronic apparatus and the temperature at the surface of the housing can be restrained. In addition, since this composite material is lighter than ordinary heat dissipation resins, it is possible to restrain an increase in the weight of the electronic apparatus and electronic parts.

By restraining the rise in the temperature of the electronic apparatus, it is possible to prevent functional limitations attendant on a rise in temperature (thermal shut-down), to prolong the time for which the electronic apparatus can be used such as recording time, and to realize a reduction in displeasure given to the user.

Note that by filling with the composite material, the spaces inside the housing of the electronic apparatus are filled with the composite material, an enhancing effect on shock resistance (fastness) and an enhancing effect on drip-proofness (waterproofness) can be produced.

In the above-mentioned manner, the composite material and the electronic apparatus according to the present technology are configured.

2. Examples of Application to Other Apparatuses

Examples of application of the aforementioned present technology to other apparatuses will be described below.

2-1. First Example

Figure 16A:
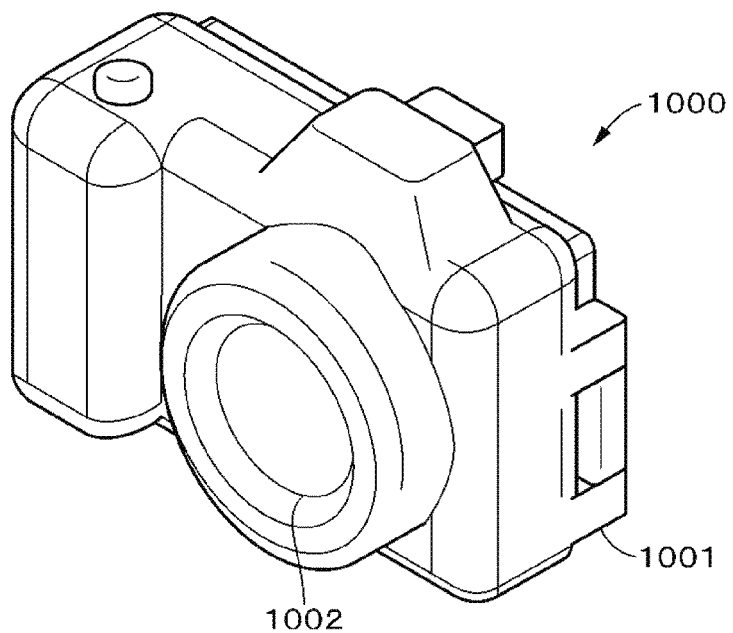
FIG. 16A is an external view of an apparatus in a first application example of the present technology.
Figure 16B:
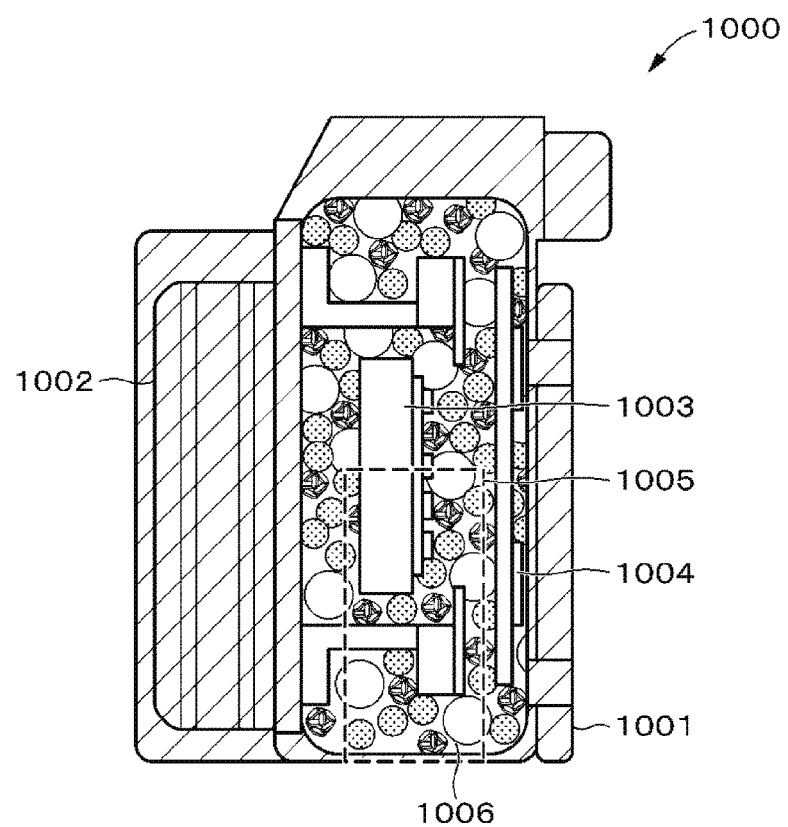
FIG. 16B is a side sectional view of the apparatus.

FIGS. 16A and 16B depict a first example of the application to other apparatuses. The first example is an imaging apparatus called a digital camera or a digital single lens reflex camera.

The imaging apparatus 1000 includes a housing 1001, an optical imaging system 1002 including an imaging lens and the like, an imaging element 1003, a control circuit 1004, a battery 1005, and a composite material 1006. The composite material 1006 includes a base resin, hollow particles, a heat dissipation filler, and bubbles, and is similar to the one in the aforementioned embodiment.

The housing 1001 includes a synthetic resin such as a plastic or a metal or the like, and constitutes an armor of the imaging apparatus 1000. The optical imaging system 1002, the imaging element 1003, the control circuit 1004, the battery 1005, and the composite material 1006 are provided inside the housing 1001.

The configurations of the optical imaging system 1002, the imaging element 1003, the control circuit 1004, the battery 1005, and the composite material 1006 are similar to those in the aforementioned embodiment. The composite material 1006 is placed to fill gaps inside the housing 1001, and is thermally connected to (physically in contact with) the electronic parts such as the imaging element 1003, the control circuit 1004, and the battery 1005 inside the housing 1001. As a result, the spaces inside the imaging apparatus 1000 can be filled up without leaving any gap, whereby rises in temperature of the imaging element 1003, temperature inside the imaging apparatus 1000, and temperature at the surface thereof can be restrained.

In this way, the configuration in which the housing of an apparatus is filled with the composite material can be applied also to an imaging apparatus.

2-2. Second Example

Figure 17A:
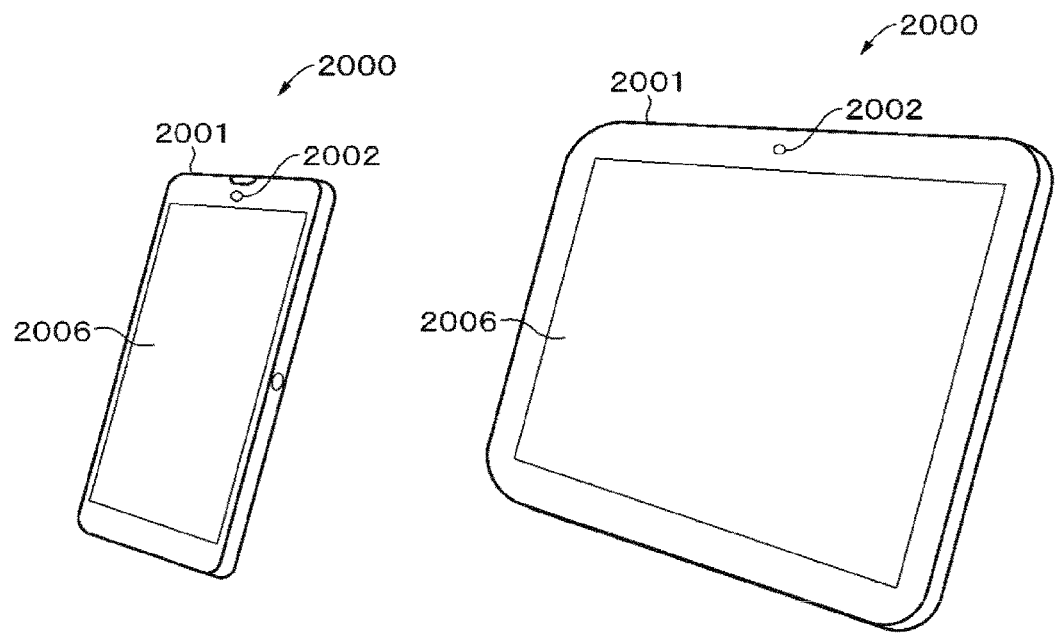
FIG. 17A depicts external views of an apparatus in a second application example of the present technology.
Figure 17B:
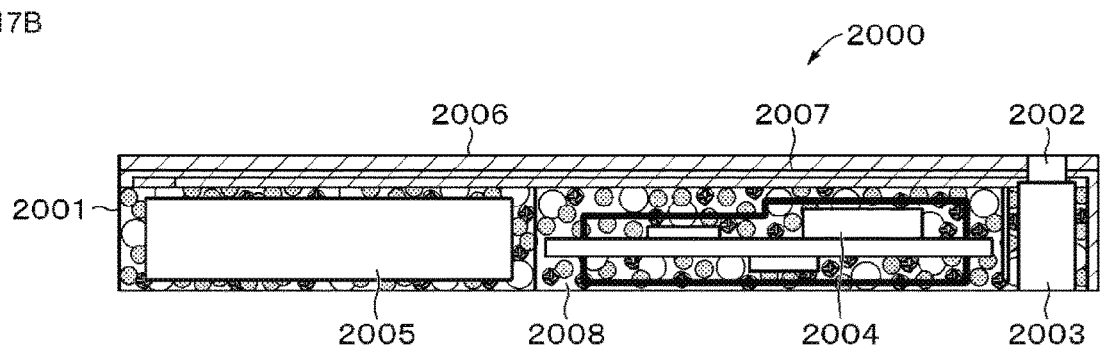
FIG. 17B is a side sectional view of the apparatus.

FIGS. 17A and 17B illustrate a second example of the application to an apparatus. The second example is a portable terminal such as a smartphone or a tablet.

The portable terminal 2000 includes a housing 2001, an optical imaging system 2002 including an imaging lens and the like, an imaging element 2003, a control circuit 2004, a battery 2005, a display 2006, a backlight 2007, and a composite material 2008. The composite material 2008 includes a base resin, hollow particles, a heat dissipation filler, and bubbles, and is similar to the one in the aforementioned embodiment.

The housing 2001 includes a synthetic resin such as a plastic or a metal or the like, and constitutes an armor of the portable terminal 2000. The optical imaging system 2002, the imaging element 2003, the control circuit 2004, the battery 2005, the backlight 2007, and the composite material 2008 are provided inside the housing 2001.

The configurations of the optical imaging system 2002, the imaging element 2003, the control circuit 2004, the battery 2005, and the composite material 2008 are similar to those in the aforementioned embodiment.

The display 2006 is a display device including, for example, an LCD (Liquid Crystal Display), a PDP (Plasma Display Panel), an organic EL (Electro Luminescence) panel or the like. A user interface of the portable terminal, a menu screen, an application image, a monitoring image being picked up, a recorded picked-up image, a picked-up moving image and the like are displayed on the display 2006.

The backlight 2007 is provided on a back side of the display 2006 inside the housing 2001, and is for emitting light to thereby illuminate the display 2006 from the back side.

The composite material 2008 is placed to fill gaps inside the housing 2001, and is thermally connected to (physically in contact with) the electronic parts such as the imaging element 2003, the control circuit 2004, and the battery 2005 inside the housing 2001. As a result, spaces inside the portable terminal 2000 can be filled up without leaving any gap, and rises in temperature of the imaging element 2003, temperature inside the portable terminal 2000, and temperature at the surface thereof can be restrained. In this way, the configuration in which a housing of an apparatus is filled with the composite material according to the present technology can be applied also to a portable terminal such as a smartphone and a tablet.

2-3. Third Example

Figure 18A:
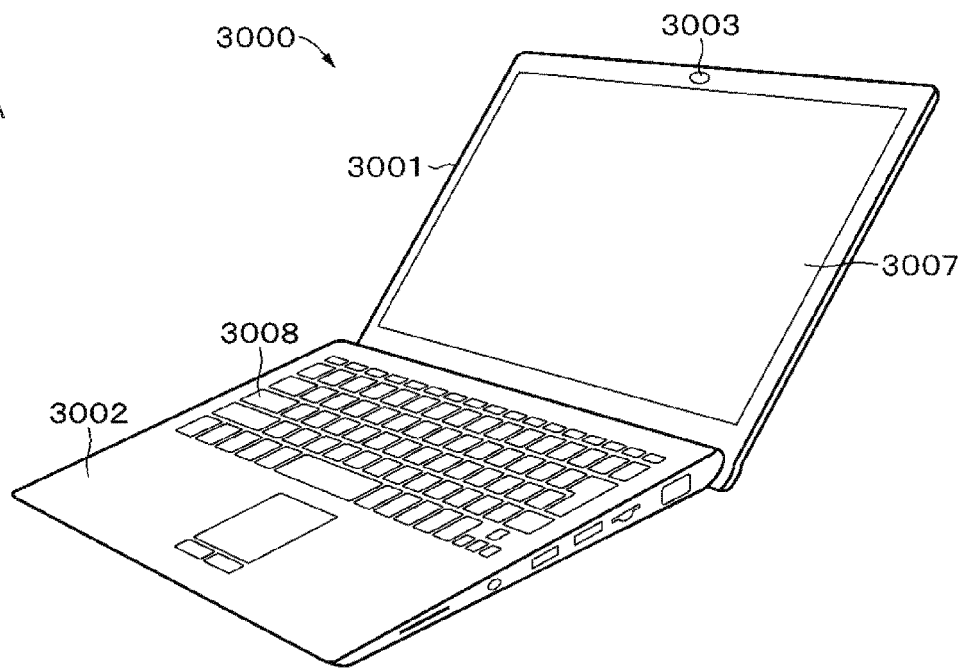
FIG. 18A is an external view of an apparatus in a third application example of the present technology.
Figure 18B:
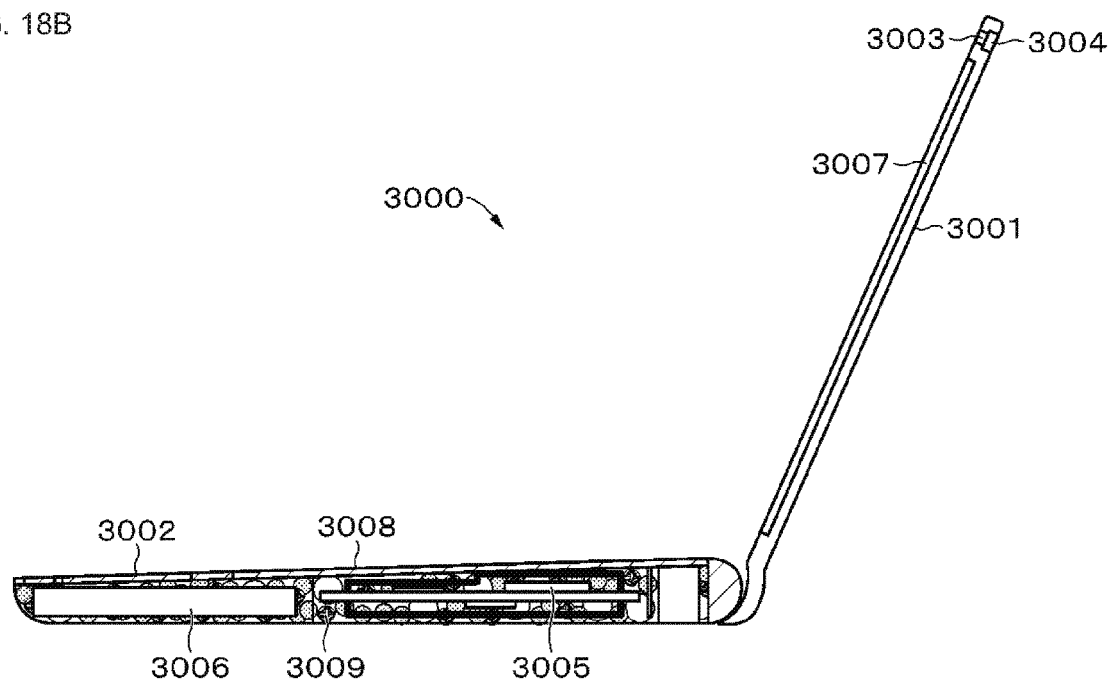
FIG. 18B is a side sectional view of the apparatus.

FIGS. 18A and 18B depict a third example of the application to an apparatus. The third example is a portable personal computer (hereinafter referred to as notebook personal computer).

The notebook personal computer 3000 includes a display-side housing 3001, a keyboard-side housing 3002, an optical imaging system 3003 including an imaging lens and the like, an imaging element 3004, a control circuit 3005, a battery 3006, a display 3007, an input section 3008, and a composite material 3009. The composite material 3009 includes a base resin, hollow particles, a heat dissipation filler, and bubbles, and is similar to the one in the aforementioned embodiment.

The display-side housing 3001 and the keyboard-side housing 3002 include a synthetic resin such as a plastic or a metal or the like, and constitutes an armor of the notebook personal computer 3000. The notebook personal computer 3000 is configured in a foldable manner while including the display-side housing 3001 and the keyboard-side housing 3002 connected to the display-side housing 3001 through hinges or the like. The keyboard-side housing 3002 is provided with the input section 3008.

The configurations in charge of camera function, such as the optical imaging system 3003 and the imaging element 3004, are provided in the display-side housing 3001. On the other hand, the control circuit 3005, the battery 3006, and the composite material 3009 are provided inside the keyboard-side housing 3002.

The configurations of the optical imaging system 3003, the imaging element 3004, the control circuit 3005, the battery 3006, and the composite material 3009 are similar to those in the aforementioned embodiment.

The configuration of the display 3007 is similar to that described in the portable terminal 2000 as the aforementioned second example.

The input section 3008 is a keyboard, a touch pad or the like through which the user inputs various instructions to the notebook personal computer 3000.

The composite material 3009 is placed to fill gaps inside the keyboard-side housing 3002, and is thermally connected to (physically in contact with) the electronic parts such as the control circuit 3005 and the battery 3006 inside the keyboard-side housing 3002. As a result, spaces inside the keyboard-side housing 3002 of the notebook personal computer 3000 can be filled up without leaving any gap, and rises in temperature inside the keyboard-side housing 3002 and temperature at the surface thereof can be restrained. In this way, the configuration in which a housing of an apparatus is filled with the composite material according to the present technology can be applied also to a notebook personal computer.

Figure 19A:
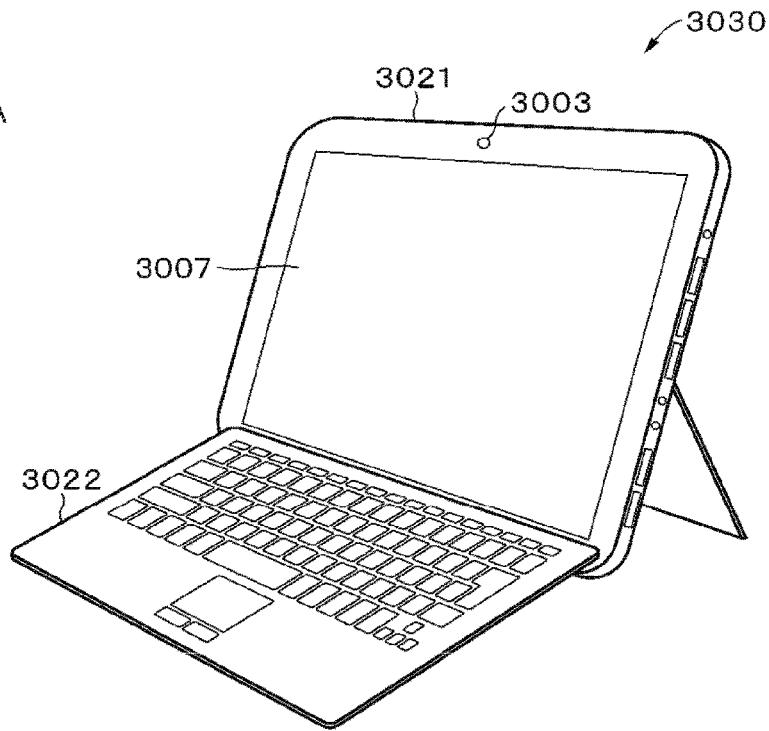
FIG. 19A is an external view of an apparatus in another example of the third application example of the present technology.
Figure 19B:
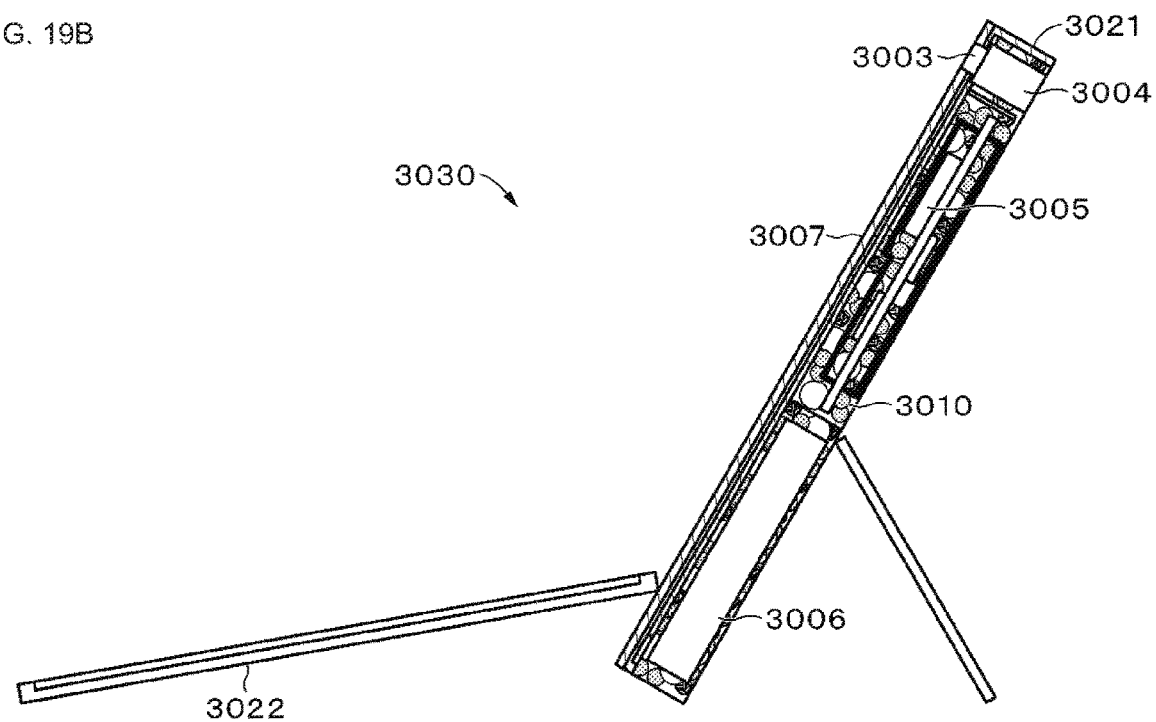
FIG. 19B is a side sectional view of the apparatus.

Note that in recent years a notebook personal computer 3030 has been productized which, as depicted in FIG. 19A, includes a display-side housing 3021 and a keyboard-side housing 3022, in which a control circuit 3005, a battery 3006 and the like are provided inside the display-side housing 3021 in addition to an optical imaging system 3003 and an imaging element 3004. The present technology can be applied also to suck a kind of notebook personal computer. In the case where the control circuit 3005, the battery 3006 and the like are provided inside the display-side housing 3021, the display-side housing 3021 is filled with a composite material 3010, as depicted in FIG. 19B. As a result, spaces inside the display-side housing 3021 can be filled up without leaving any gap, and a rise in temperature of the imaging element 3004 can be restrained.

2-4. Fourth Example

Figure 20A:
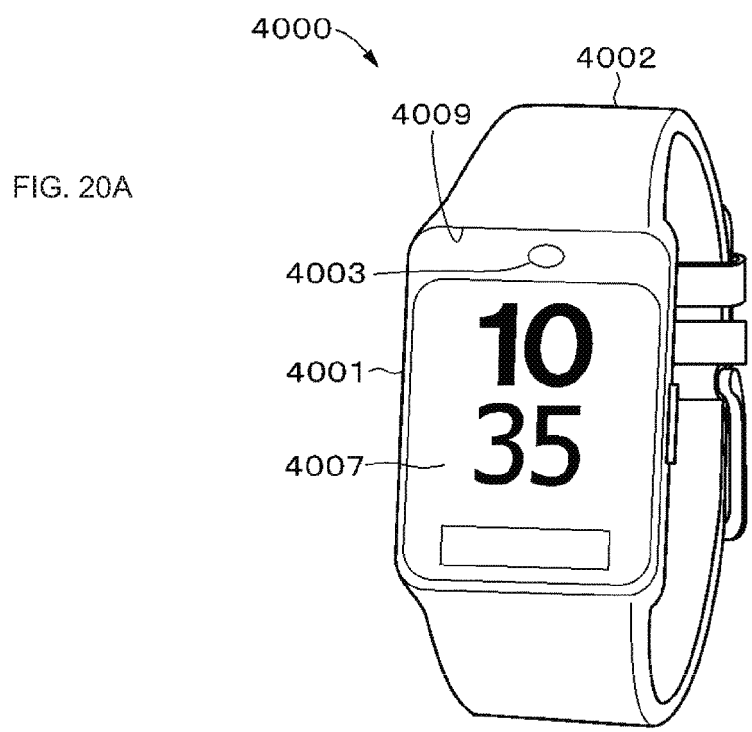
FIG. 20A is an external view of an apparatus in a fourth application example of the present technology.
Figure 20B:
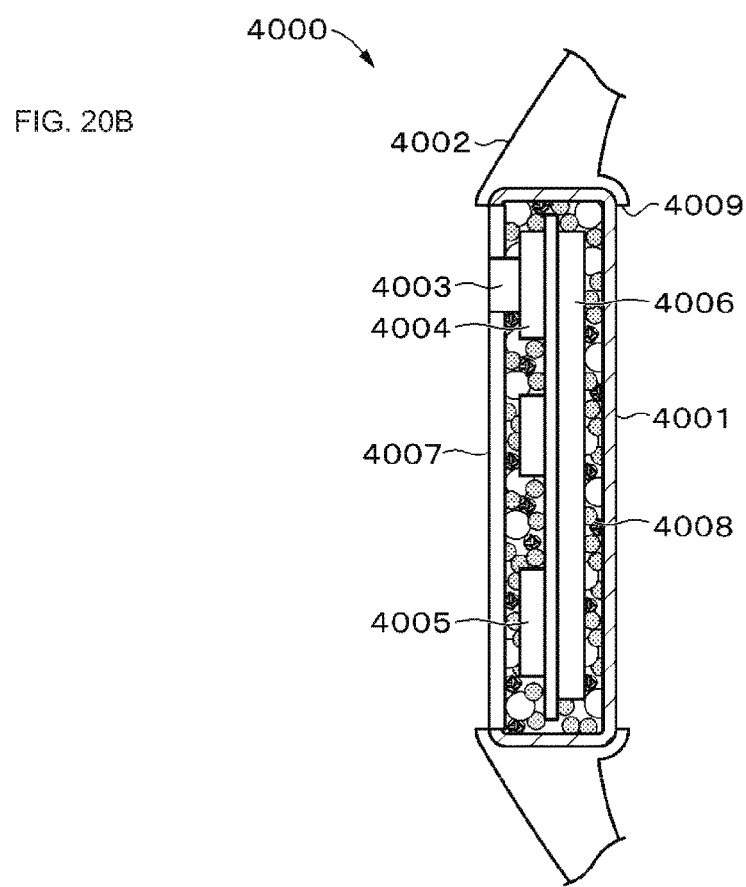
FIG. 20B is a side sectional view of the apparatus.

FIGS. 20A and 20B illustrate a fourth example of the application to an apparatus. The fourth example is a so-called wearable apparatus. A wearable apparatus is an apparatus which the user can wear on his or her own body. FIGS. 20A and 20B depict a wrist watch type wearable apparatus 4000.

The wearable apparatus includes those of spectacles type, bracelet type, accessory type, clothes type and the like, other than the wrist watch type. By using the wearable apparatus, it is possible to perform imaging of a photograph, imaging of a moving image, internet search, mail transmission/reception, and so on, without using a portable terminal such as a smartphone. In addition, the user can perform measurement of calorie intake, number of steps, blood pressure, pulse, blood glucose level, brain wave, and the like by the wearable apparatus.

Such wearable apparatuses necessarily include a control circuit and a battery; further, many of the wearable apparatuses include an optical imaging system and an imaging element, and have also a camera function. Therefore, the present technology can be applied also to such wearable apparatuses.

The wrist watch type wearable apparatus 4000 depicted in FIGS. 20A and 20B includes a housing 4001, a band 4002, an optical imaging system 4003 including an imaging lens and the like, an imaging element 4004, a control circuit 4005, a battery 4006, a display 4007, and a composite material 4008. The composite material 4008 includes a base resin, a hollow particles, a heat dissipation filler, and bubbles, and is similar to that in the aforementioned embodiment.

The housing 4001 includes a synthetic resin such as a plastic or a metal or the like, and constitutes an armor of the wrist watch type wearable apparatus 4000. The optical imaging system 4003, the imaging element 4004, the control circuit 4005, the battery 4006, the display 4007, and the composite material 4008 are provided inside the housing 4001.

The band 4002 includes a rubber, a plastic, a synthetic leather or the like. The band 4002 is configured in a ring-like shape, and is provided with a fitting section 4009 for fitting the housing 4001. With the housing 4001 fitted to the fitting section 4009, the housing 4001 and the band 4002 constitutes the wrist watch type wearable apparatus 4000. Note that instead of the configuration in which the housing 4001 is fitted to the fitting section 4009 of the band 4002, a configuration may be adopted in which the band is connected to one end side and the other end side of the housing 4001. Besides, the housing 4001 and the band are preliminarily configured integrally.

The configurations of the optical imaging system 4003, the imaging element 4004, the control circuit 4005, the battery 4006, the display 4007, and the composite material 4008 are similar to those in the aforementioned embodiment. The composite material 4008 is placed to fill gaps inside the housing 4001, and is thermally connected to (physically in contact with) the electronic parts such as the imaging element 4004, the control circuit 4005, and the battery 4006 inside the housing 4001. As a result, spaces inside the wrist watch type wearable apparatus 4000 can be filled up without leaving any gap, and rises in temperature of the imaging element 4004, temperature inside the wrist watch type wearable apparatus 4000, and temperature at the surface thereof can be restrained.

In this way, the configuration in which a housing of an apparatus is filled with the composite material according to the present technology can be applied also to a wrist watch type wearable apparatus.

2-5. Fifth Example

Figure 21A:
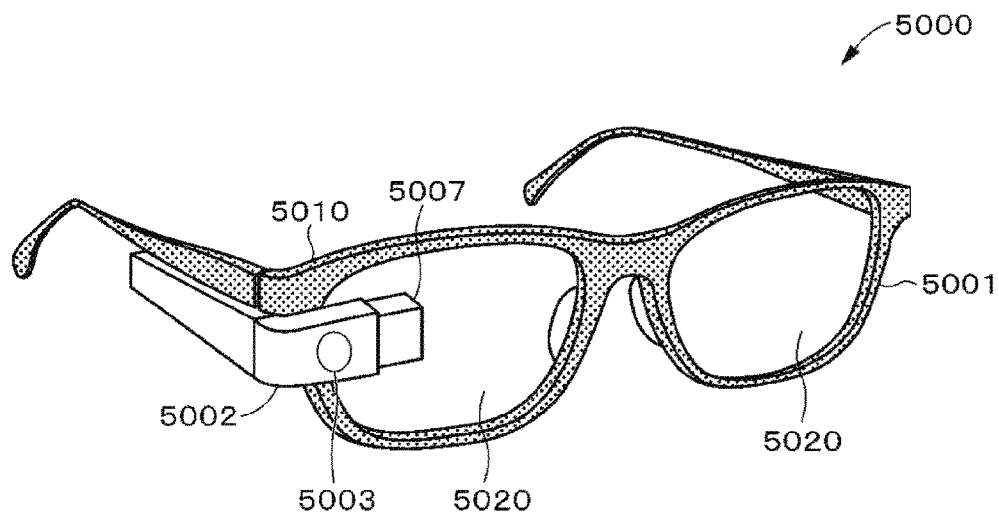
FIG. 21A is an external view of an apparatus in a fifth application example of the present technology.
Figure 21B:
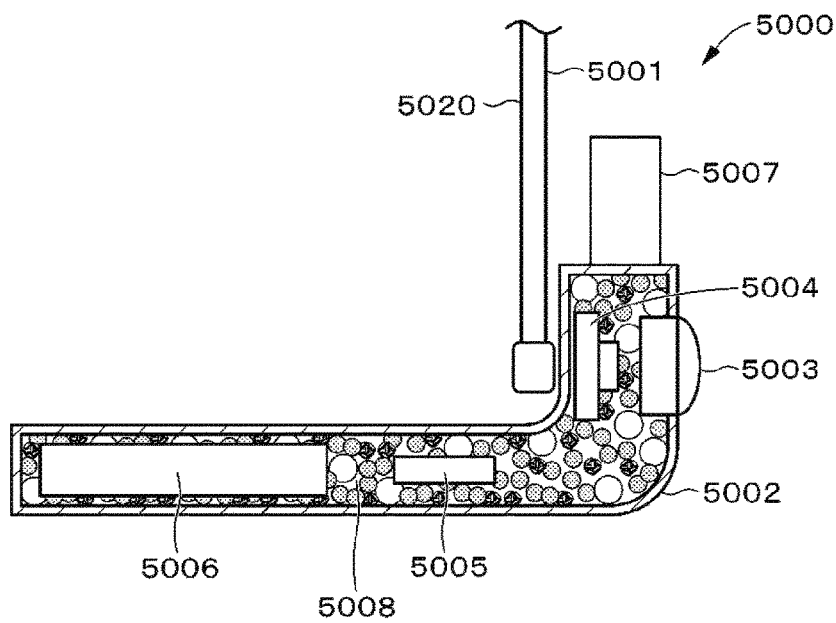
FIG. 21B is a plane sectional view of the apparatus.

FIGS. 21A and 21B illustrate a fifth example of the application to an apparatus. The fifth example is a spectacles-type wearable apparatus.

The spectacles-type wearable apparatus 5000 depicted in FIGS. 21A and 21B includes spectacles 5001, a housing 5002, an optical imaging system 5003 including an imaging lens and the like, an imaging element 5004, a control circuit 5005, a battery 5006, a display 5007, and a composite material 5008. The composite material 5008 includes a base resin, hollow particles, a heat dissipation filler, and bubbles, and is similar to that in the aforementioned embodiment.

The housing 5002 includes a synthetic resin such as a plastic or a metal or the like, is configured in substantially L shape in plan view, and constitutes an armor of the spectacles-type wearable apparatus 5000. The optical imaging system 5003, the imaging element 5004, the control circuit 5005, the battery 5006, and the composite material 5008 are provided inside the housing 5002. In addition, the display 5007 is provided in such a manner as to overlap with a part ranging from the housing 5002 to a lens 5020 of the spectacles 5001.

The spectacles 5001 include a frame 5010 including a rubber, a plastic or the like, and a pair of left and right lenses 5020. The housing 5002 is fixed to the frame 5010 of the spectacles 5001, whereby the spectacles-type wearable apparatus 5000 is configured. Note that the frame 5010 of the spectacles 5001 and the housing 5002 may be configured as an integral body.

The configurations of the optical imaging system 5003, the imaging element 5004, the control circuit 5005, the battery 5006, and the composite material 5008 are similar to those in the aforementioned embodiment. The display 5007 includes, for example, a transmission type display. The composite material 5008 is placed to fill gaps inside the housing 5002, and is thermally connected to (physically in contact with) the electronic parts such as the imaging element 5004, the control circuit 5005, and the battery 5006 inside the housing 5002. As a result, spaces inside the spectacles-type wearable apparatus 5000 can be filled up without leaving gaps, and rises in temperature of the imaging element 5004, temperature inside the spectacles-type wearable apparatus 5000, and temperature at the surface thereof can be restrained.

In this way, the configuration in which a housing of an apparatus is filled with the composite material according to the present technology can be applied also to a spectacles-type wearable apparatus.

2-6. Example of Preliminary Molding

Figure 22A:
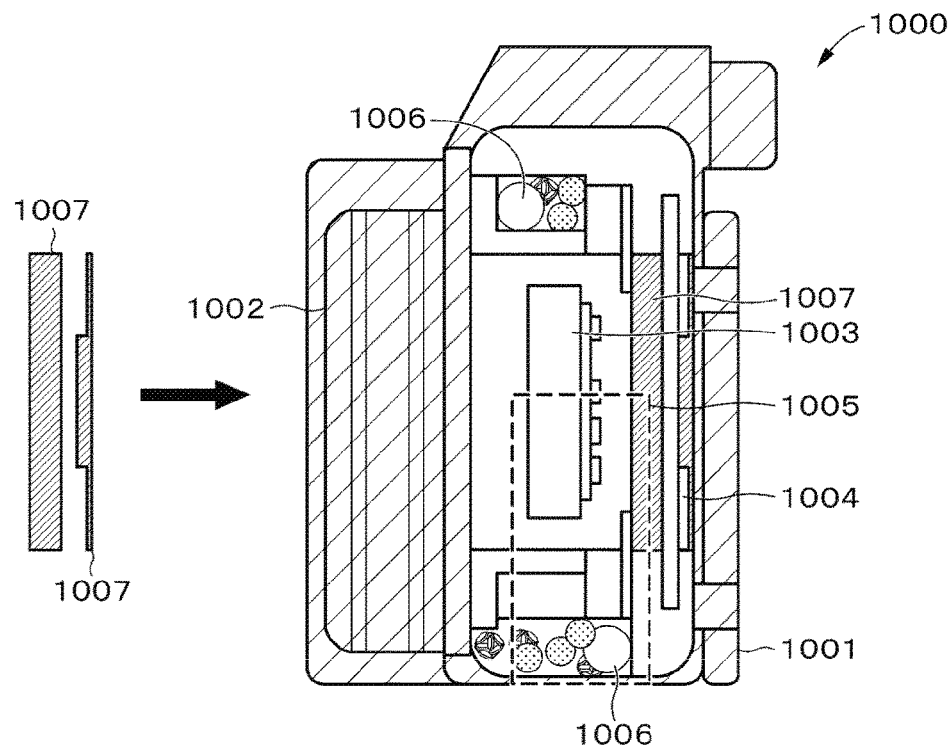
FIG. 22A is a figure depicting a first example of application of a preliminarily molded composite material to an apparatus.
Figure 22B:
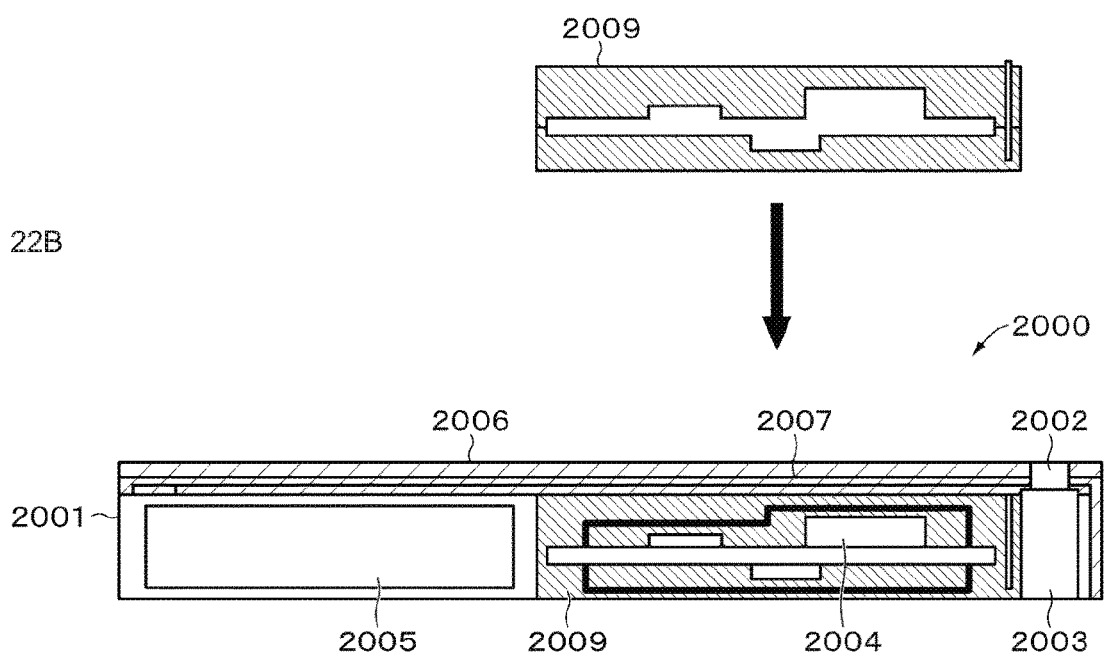
FIG. 22B is a figure depicting a second example.
Figure 23:
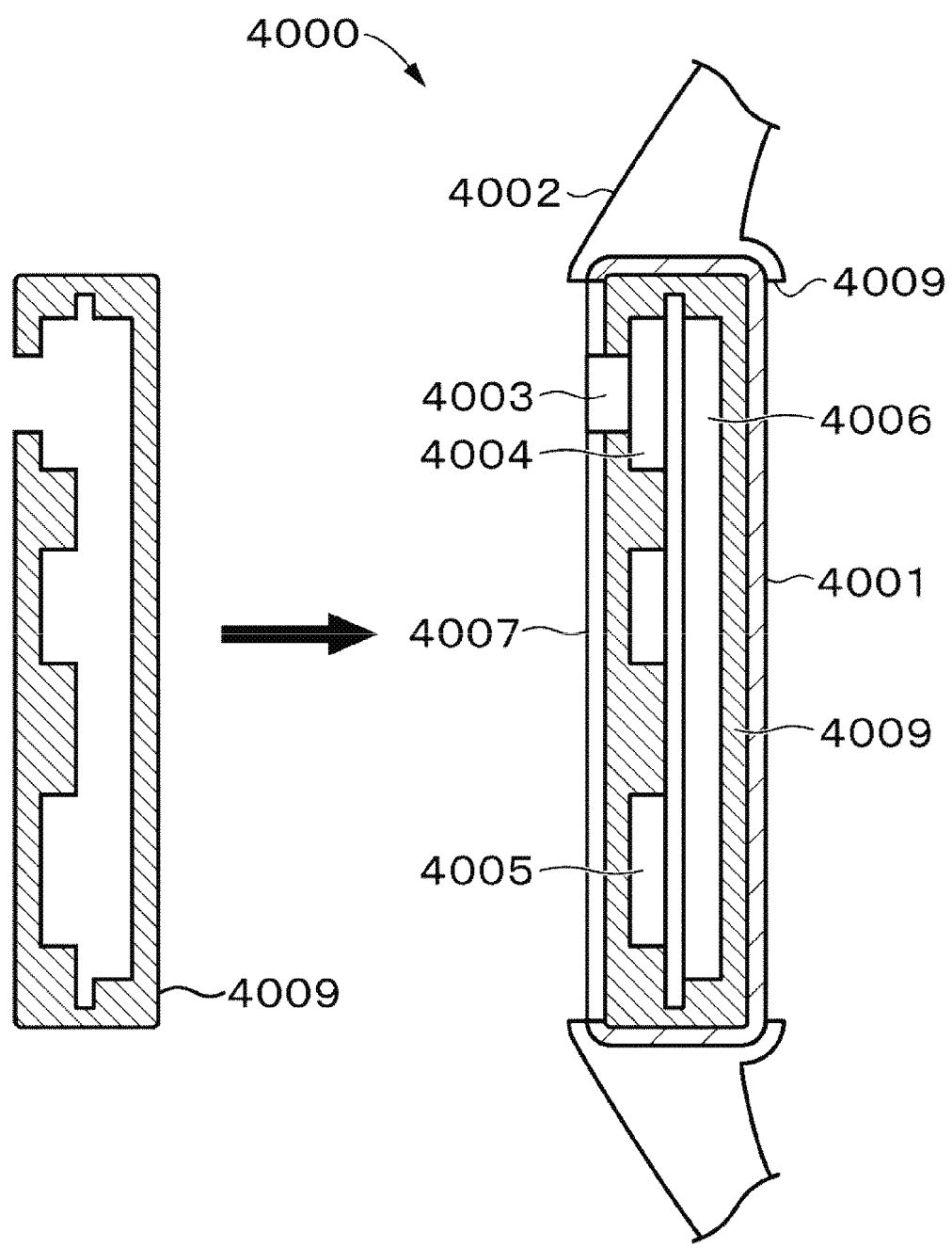
FIG. 23 is a figure depicting a third example of application of a preliminarily molded composite material to an apparatus.

FIGS. 22A, 22B, and 23 depict an example in which a composite material preliminarily molded in conformity with the internal shape of an apparatus is provided inside the apparatus, as aforementioned. FIG. 22A depicts an example of the application to the imaging apparatus described in FIGS. 15A, 15B, 15C, and 15D. A composite material 1007 is preliminarily molded in accordance with the internal shape of the housing 1001 of the imaging apparatus 1000 and the shape of the control circuit 1004 by the aforementioned molding method such as cast molding, extrusion, and injection molding. Then, the composite material 1007 is provided inside the imaging apparatus 1000 by fitting it into the housing 1001 in the manufacturing process of the imaging apparatus 1000.

FIG. 22B depicts an example of the application to the portable terminal such as a smartphone or a tablet described in FIGS. 17A and 17B. A composite material 2009 is preliminarily molded in accordance with the internal shape of the housing 2001 of the portable terminal 2000 and the shape of the control circuit 2004 by the aforementioned molding method such as cast molding, extrusion, and injection molding. Then, the composite material 2009 is provided inside the portable terminal 2000 by fitting it into the housing 2001 in the manufacturing process of the portable terminal 2000.

FIG. 23 depicts an example of the application to the wrist watch type wearable apparatus described in FIGS. 20A and 20B. A composite material 4009 is preliminarily molded in accordance with the internal shape of the housing 4001 of the wrist watch type wearable apparatus 4000 and the shapes of the optical imaging system 4003, the imaging element 4004, the control circuit 4005, and the battery 4006 by the aforementioned molding method such as cast molding, extrusion, and injection molding. Then, the composite material 4009 is provided inside the wrist watch type wearable apparatus 4000 by fitting it not the housing 4001 in the manufacturing process of the wrist watch type wearable apparatus 4000.

In this way, a preliminarily molded composite material can be provided in each of various apparatuses. Note that the position at which the composite material is provided inside the housing of the apparatus is not limited to those depicted in FIGS. 22A, 22B, and 23. The molded composite material may be provided at any position inside the housing where a heat generation source is present and heat dissipation is required. In addition, though omitted in illustration, a molded composite material may be provided inside the notebook personal computers depicted in FIGS. 18A, 18B, 19A, and 19B and inside the spectacles-type wearable apparatus depicted in FIGS. 21A and 21B.

3. Modifications

While the embodiments of the present technology have been specifically described above, the present technology is not limited to the aforementioned embodiments, and various modifications based on the technical thought of the present technology are possible.

Instead of thermally connecting the composite material directly to the imaging element 14 and the control circuit 15, the composite material may be thermally connected to a unit having a base for mounting the imaging element 14 thereon and a unit having a base for mounting the control circuit 15 thereon. In addition, the composite material may be thermally connected to a battery case in which the battery 16 is disposed.

Besides, the present technology is effective not only for the imaging element 14, the control circuit 15, and the battery 16 aforementioned in the embodiment, but also for any heat generation source that generates heat inside an electronic apparatus.

In addition, the electronic apparatus according to the present technology is applicable to any apparatus that has an imaging element, such as small-sized digital video cameras used by outdoor sports lovers for recording their activities, digital cameras, television receivers, notebook personal computers, smartphones, tablet terminals, portable game machines, wrist watch type wearable terminals, spectacles-type wearable terminals, car navigation systems, interphone systems, robots, and robot cleaners. With the present technology applied to these electronic apparatuses having an imaging element, each part such as the imaging element, the control circuit, and the battery can be prevented from reaching an upper limit temperature which disables the part to operate, and, therefore, it is possible, for example, to realize a prolongation of the time for which the electronic apparatus can be used, such as imaging time.

Figure 24:
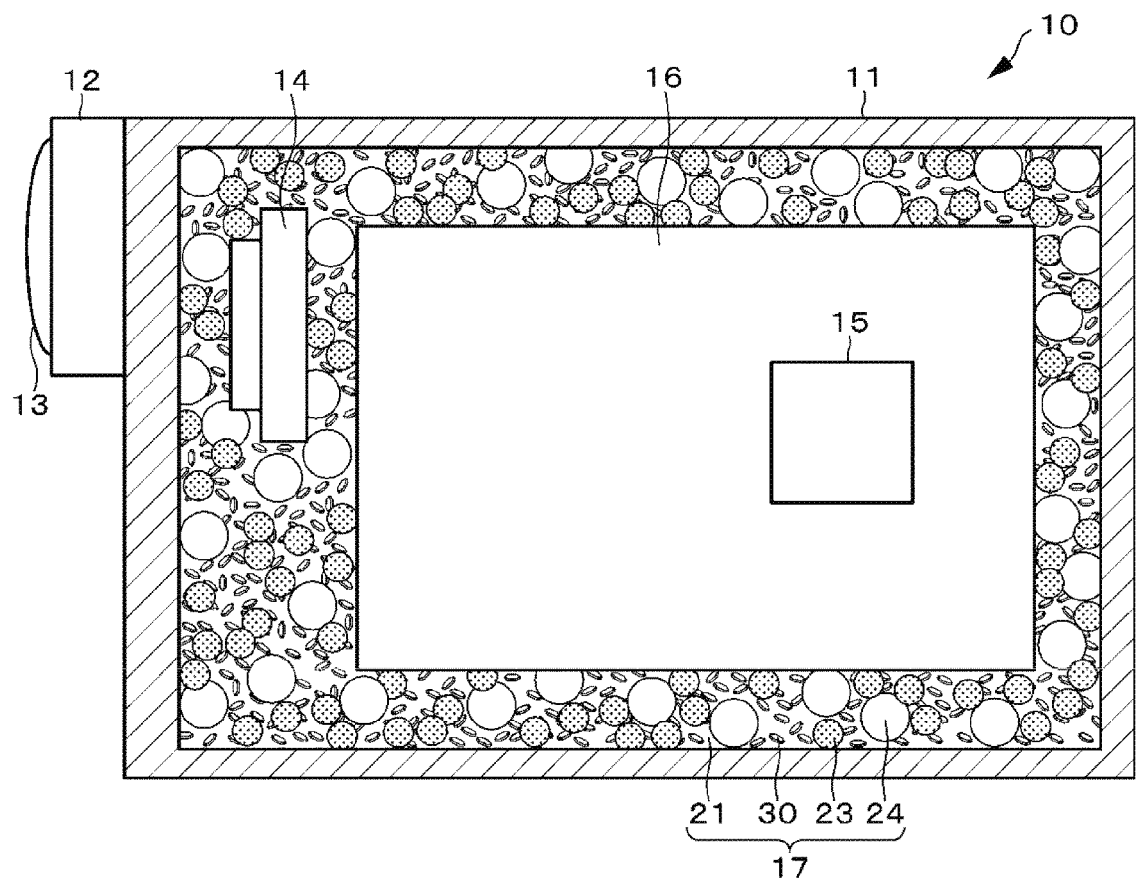
FIG. 24 is a sectional view of an electronic apparatus illustrating a modification of a heat dissipation filler.

Instead of using the heat dissipation filler in a granular form as depicted in the embodiment, the heat dissipation filler may be used in the state of being mixed into the base resin as a scaly heat dissipation filler 30 as depicted in FIG. 24.

Figure 25A:
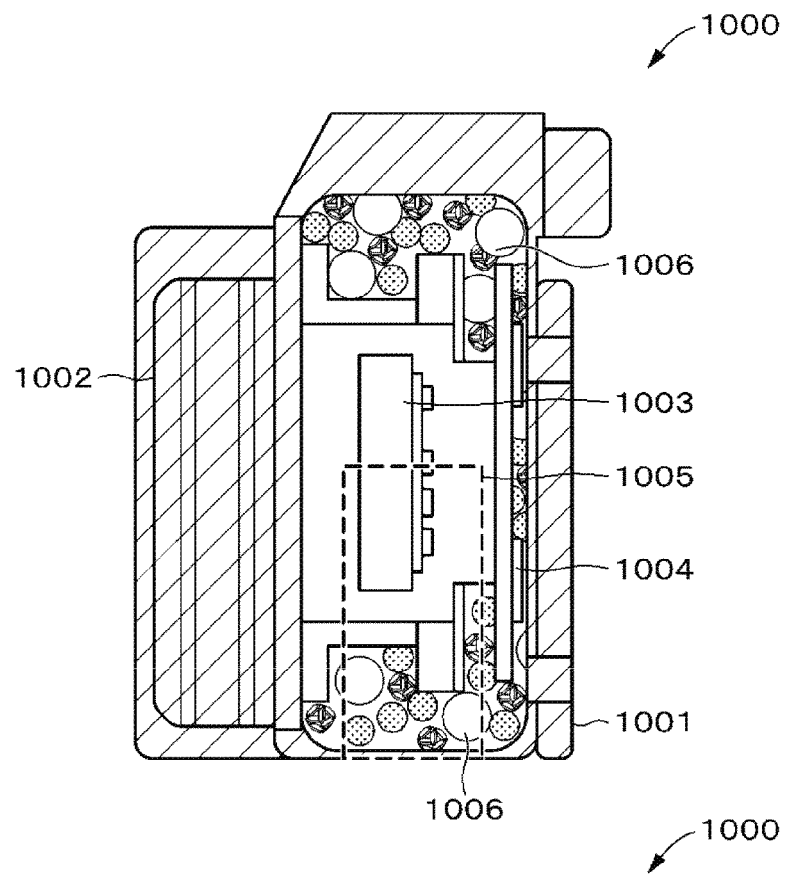
FIGS. 25A and 25B depict figures depicting modifications of filling of an electronic apparatus with a composite material.
Figure 25B:
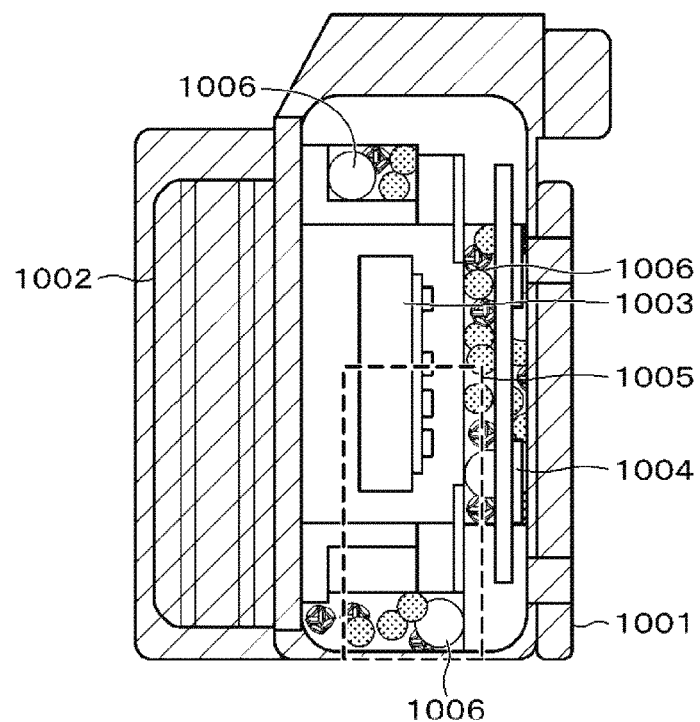

FIGS. 25A and 25B denote the manner of filling with a composite material in the case where the imaging apparatus 1000 as an electronic apparatus has a so-called image stabilization function, and the imaging element 1003 is provided in the state of making contact with no other parts than a fulcrum such that the imaging element 1003 can move for image stabilization. In this case, as illustrated in FIG. 25A or 25B, it is recommendable to cause the composite material 1006 not to contact the imaging element 1003 (to cause the composite material 1006 not to fill the surroundings of the imaging element 1003). If the movements of the imaging element 1003 are limited by the composite material 1006, the image stabilization function is obstructed. It is recommendable to keep the composite material out of contact with things with which the composite material should desirably not contact, such as the part to be moved in this way, not limited to the imaging element 1003. In this case, a preliminarily cured (solidified) composite material may be provided inside the housing, instead of filling the housing with a composite material that is low in viscosity.

The present technology may take the following configurations.

(1)

A composite material including:

a base resin;

a heat dissipation filler that is mixed into the base resin;

hollow particles that are mixed into the base resin; and bubbles formed in the base resin.

(2)

The composite material as described in the above paragraph (1), in which the base resin includes a thermosetting resin, and includes at least one of a silicone resin, a urethane resin, an epoxy resin, or an acrylic resin.

(3)

The composite material as described in the above paragraph (1) or (2), in which the base resin includes a thermoplastic elastomer, and includes one or more of thermoplastic styrene, a thermoplastic polyolefin, thermoplastic polyurethane, a thermoplastic polyester elastomer, a thermoplastic vulcanized elastomer, a thermoplastic vinyl chloride elastomer, a thermoplastic polyamide elastomer, and a butyl rubber thermoplastic elastomer partially crosslinked with an organic peroxide, or a copolymer thereof, or includes at least one of mixtures or copolymers of a thermoplastic elastomer including a styrene-vinyl-isoprene block copolymer, polypropylene, or a styrene elastomer.

(4)

The composite material as described in any one of the above paragraphs (1) to (3), in which the heat dissipation filler includes at least one of boron nitride (BN), aluminum oxide ($Al_2O_3$), aluminum nitride (AlN), or carbon fiber.

(5)

The composite material as described in any one of the above paragraphs (1) to (4), in which the heat dissipation filler is configured as a plurality of scaly members.

(6)

The composite material as described in any one of the above paragraphs (1) to (5), in which the heat dissipation filler is configured as a granular member including a plurality of scaly members.

(7)

The composite material as described in the above paragraph (6), in which the granular heat dissipation filler has an average particle diameter of not more than 100 μm.

(8)

The composite material as described in the above paragraph (6), in which the granular heat dissipation filler has an average particle diameter of 30 to 90 μm.

(9)

The composite material as described in any one of the above paragraphs (1) to (8), in which the hollow particles have an average particle diameter of not more than 100 μm.

(10)

The composite material as described in any one of the above paragraphs (1) to (9), in which the average particle diameter of the hollow particles is 30 to 60 μm.

(11)

The composite material as described in any one of the above paragraphs (1) to (10), in which the bubbles have an average particle diameter of not more than 1,000 μm.

(12)

The composite material as described in any one of the above paragraphs (1) to (11), in which the bubbles have an average particle diameter of not more than 100 μm.

(13)

The composite material as described in any one of the above paragraphs (1) to (12), which is fluid and has a viscosity of not more than 500 Pa·s.

(14)

The composite material as described in any one of the above paragraphs (1) to (13), which is fluid and has a viscosity of not more than 100 Pa·s.

(15)

The composite material as described in any one of the above paragraphs (1) to (14), in which the bubbles include closed cells.

(16)

The composite material as described in any one of the above paragraphs (1) to (15), in which the bubbles include open cells.

(17)

A composite material including:

a base resin;

a heat dissipation filler mixed into the base resin;

shells mixed into the base resin; and bubbles formed in the shells.

(18)

A composite material including:

a base resin;

a heat dissipation filler mixed into the base resin; and hollow particles mixed into the base resin.

(19)

An electronic apparatus including:

a housing;

an imaging element provided inside the housing;

an electric power source provided inside the housing; and a composite material that is placed to fill a space inside the housing, is thermally connected to at least either of the imaging element and the electric power source, and is thermally connected to the housing, in which the composite material includes a base resin, a heat dissipation filler that is mixed into the base resin, hollow particles that are mixed into the base resin, and bubbles that are formed in the base resin.

(20)

The electronic apparatus as described in the above paragraph (19), in which a control circuit is provided inside the housing, and the composite material is thermally connected to the control circuit.

(21)

The electronic apparatus as described in the above paragraph (20), in which the control circuit is covered with an insulating material.

(22)

The electronic apparatus as described in the above paragraph (20), in which the control circuit is thermally connected to the composite material through a unit having a substrate on which to mount the control circuit.

(23)

The electronic apparatus as described in any one of the above paragraphs (19) to (22), in which the electric power source has a terminal covered with an insulating material.

(24)

The electronic apparatus as described in any one of the above paragraphs (19) to (23), in which the imaging element is thermally connected to the composite material through a unit having a substrate on which to mount the imaging element.

(25)

The electronic apparatus as described in any of the above paragraphs (19) to (24), in which the electric power source is thermally connected to the composite material through a case in which to accommodate the electric power source.

(26)

A method for manufacturing an electronic apparatus, the method including:

preliminarily molding a composite material including a base resin, a heat dissipation filler that is mixed into the base resin, hollow particles that are mixed into the base resin, and bubbles that are formed in the base resin,
by a predetermined molding method; and
providing the molded composite material in such a manner that the molded composite material is thermally connected to any one of heat generation sources inside a housing of the electronic apparatus, and is thermally connected to the housing.

REFERENCE SIGNS LIST

10 . . . Electronic apparatus
11 . . . Housing
14 . . . Imaging element
15 . . . Control circuit
16 . . . Battery
17 . . . Composite material
21 . . . Base resin
22 . . . Hollow particles
23 . . . Heat dissipation filler
24, 53 . . . Bubbles
51 . . . Shells

The invention claimed is:
1. A composite material, comprising:
a base resin;
a heat dissipation filler in the base resin, wherein
the heat dissipation filler includes a plurality of scaly members;
a plurality of hollow particles in the base resin; and
a plurality of bubbles in the base resin.
2. The composite material according to claim 1, wherein the base resin includes:
a thermosetting resin; and
at least one of a silicone resin, a urethane resin, an epoxy resin, or an acrylic resin.
3. The composite material according to claim 1, wherein the base resin includes:
a thermoplastic elastomer; and
one of:
at least one of thermoplastic styrene, thermoplastic polyolefin, thermoplastic polyurethane, a thermoplastic polyester elastomer, a thermoplastic vulcanized elastomer, a thermoplastic vinyl chloride elastomer, a thermoplastic polyamide elastomer, a butyl rubber thermoplastic elastomer partially crosslinked with an organic peroxide, or a copolymer, or
at least one of a mixture of polypropylene and a styrene elastomer, a copolymer of polypropylene and the styrene elastomer, or a styrene-vinyl-isoprene block copolymer.
4. The composite material according to claim 1, wherein the heat dissipation filler further includes at least one of boron nitride (BN), aluminum oxide ($Al_2O_3$), aluminum nitride (AlN), or carbon fiber.
5. The composite material according to claim 1, wherein the heat dissipation filler is a granular member, and
the granular member includes the plurality of scaly members.
6. The composite material according to claim 5, wherein the heat dissipation filler has an average particle diameter one of less than or equal to 100 μm.
7. The composite material according to claim 5, wherein the heat dissipation filler has an average particle diameter between 30 μm to 90 μm.

8. The composite material according to claim 1, wherein each hollow particle of the plurality of hollow particles has an average particle diameter one of less than or equal to 100 μm.
9. The composite material according to claim 1, wherein each hollow particle of the plurality of hollow particles has an average particle diameter between 30 μm to 60 μm.
10. The composite material according to claim 1, wherein each bubble of the plurality of bubbles has an average particle diameter one of less than or equal to 1,000 μm.
11. The composite material according to claim 1, wherein each bubble of the plurality of bubbles has an average particle diameter one of less than or equal to 100 μm.
12. The composite material according to claim 1, wherein the composite material is a fluid, and
the composite material has a viscosity one of less than or equal to 500 Pa·s.
13. The composite material according to claim 1, wherein the composite material is a fluid, and
the composite material has a viscosity one of less than or equal to 100 Pa·s.
14. The composite material according to claim 1, wherein the plurality of bubbles includes a first bubble connected to a second bubble.
15. A composite material, comprising:
a base resin;
a heat dissipation filler in the base resin, wherein
the heat dissipation filler includes a plurality of scaly members;
a plurality of shells in the base resin; and
a plurality of bubbles in the plurality of shells.
16. A composite material, comprising:
a base resin;
a heat dissipation filler in the base resin, wherein
the heat dissipation filler includes a plurality of scaly members; and
a plurality of hollow particles in the base resin.
17. An electronic apparatus, comprising:
a housing;
an imaging element inside the housing;
an electric power source inside the housing; and
a composite material inside the housing, wherein
the composite material is thermally connected to the housing and at least one of the imaging element or the electric power source, and
the composite material includes:
a base resin,
a heat dissipation filler in the base resin,
a plurality of hollow particles in the base resin, and
a plurality of bubbles in the base resin.
18. The electronic apparatus according to claim 17, further comprising a control circuit inside the housing, wherein the composite material is thermally connected to the control circuit.
19. The electronic apparatus according to claim 18, further comprising an insulating material that covers the control circuit.
20. The electronic apparatus according to claim 18, further comprising a unit, wherein
the unit includes a substrate,
the control circuit is on the substrate of the unit, and
the control circuit is thermally connected to the composite material through the unit.
21. The electronic apparatus according to claim 17, further comprising an insulating material, wherein the electric power source has a terminal covered with the insulating material.

22. The electronic apparatus according to claim 17, further comprising a unit, wherein
  the unit includes a substrate,
  the imaging element is on the substrate of the unit, and
  the imaging element is thermally connected to the composite material through the unit.

23. The electronic apparatus according to claim 17, further comprising a case, wherein
  the case includes the electric power source, and
  the electric power source is thermally connected to the composite material through the case.

24. A method for manufacturing an electronic apparatus, the method comprising:
  molding a composite material, wherein the composite material includes:
    a base resin;
    a heat dissipation filler in the base resin, wherein
      the heat dissipation filler includes a plurality of scaly members;
    a plurality of hollow particles in the base resin; and
    a plurality of bubbles in the base resin; and
  providing the molded composite material in a housing of the electronic apparatus, wherein
    the housing includes a plurality of heat generation sources,
    the molded composite material is thermally connected to one of the plurality of heat generation sources inside the housing of the electronic apparatus, and
    the molded composite material is thermally connected to the housing.

* * * * *